United States Patent [19]

Harada et al.

[11] Patent Number: 5,376,211
[45] Date of Patent: Dec. 27, 1994

[54] MAGNETRON PLASMA PROCESSING APPARATUS AND PROCESSING METHOD

[75] Inventors: Hiromi Harada, Hiratsuka; Sinji Kubota, Sagamihara; Hiromi Kumagai; Junichi Arami, both of Tokyo; Keiji Horioka, Kawasaki; Isahiro Hasegawa, Zushi; Haruo Okano, Tokyo; Katsuya Okumura; Yukimasa Yoshida, both of Yokohama, all of Japan

[73] Assignees: Tokyo Electron Limited, Tokyo; Kabushiki Kaisha Toshiba, Kawasaki, both of Japan

[21] Appl. No.: 766,324

[22] Filed: Sep. 27, 1991

[30] Foreign Application Priority Data

Sep. 29, 1990 [JP] Japan .................. 2-261294
Sep. 29, 1990 [JP] Japan .................. 2-261296
Nov. 30, 1990 [JP] Japan .................. 2-339801

[51] Int. Cl.$^5$ .................................... H01L 21/00
[52] U.S. Cl. .................................... 156/345; 156/643; 118/723 E; 204/298.16; 204/298.15
[58] Field of Search .................. 156/345, 643; 204/298.16, 298.15; 118/723

[56] References Cited

U.S. PATENT DOCUMENTS

| | | | |
|---|---|---|---|
| 4,581,118 | 4/1986 | Class .................. | 118/728 |
| 4,657,619 | 4/1987 | O'Donnell .................. | 156/345 |
| 4,842,707 | 6/1989 | Kinoshita .................. | 156/345 |
| 5,079,481 | 1/1992 | Moslehi .................. | 118/723 |
| 5,160,398 | 11/1992 | Yanagida .................. | 156/345 |
| 5,223,113 | 6/1993 | Kaneko et al. .................. | 156/345 |

FOREIGN PATENT DOCUMENTS

| | | |
|---|---|---|
| 0251567 | 1/1988 | European Pat. Off. . |
| 0297521 | 1/1989 | European Pat. Off. . |
| 0435838 | 7/1991 | European Pat. Off. . |
| 1933467 | 3/1970 | Germany . |
| 3420347 | 12/1984 | Germany . |
| 59-140375 | 8/1984 | Japan . |
| 61-120422 | 6/1986 | Japan . |
| 61-217573 | 9/1986 | Japan . |
| 64-7156 | 2/1989 | Japan . |
| 02-143164 | 10/1991 | Japan . |

OTHER PUBLICATIONS

Patent Abstract of Japan, vol. 5, No. 195 (C-083) 11 Dec. 1981 & JP-A-56 116 880 (Toshiba Corp.) 12 Sep. 1981.
Patent Abstract of Japan, vol. 10, No. 325 (E-451) 6 Nov. 1986 & JP-A-61 133 631 (Matsushita Electric Ind.) 20 Jun. 1986.
Patent Abstract of Japan, vol. 10, No. 309 (E-447) (2365) 21 Oct. 1986 & JP-A-61 121 440 (Matsushita Electric Ind.) 9 Jun. 1986.

*Primary Examiner*—R. Bruce Breneman
*Assistant Examiner*—George Goudreau
*Attorney, Agent, or Firm*—Oblon, Spivak, McClelland, Maier & Neustadt

[57] ABSTRACT

A magnetron plasma processing apparatus including a vacuum chamber storing an object to be etched, a first electrode provided in the vacuum chamber to hold the object, a second electrode disposed to one side of the first electrode, where the first and second electrodes are in parallel with each other, a gas-supply unit feeding etching gas to the vacuum chamber, a magnetic-field generating means including a magnetic block disposed outside the chamber on the opposite side of the second electrode and rotatable about an axis normal to the object held by the first electrode, and a power-supply unit which feeds power to either of the first and second electrodes and generates discharge between these parallel electrodes. The magnetic block has end surfaces provided with magnetic poles having polarity inverse from each other, and in addition, a plane recess opposite from the second electrode is provided between the magnetic poles.

5 Claims, 25 Drawing Sheets

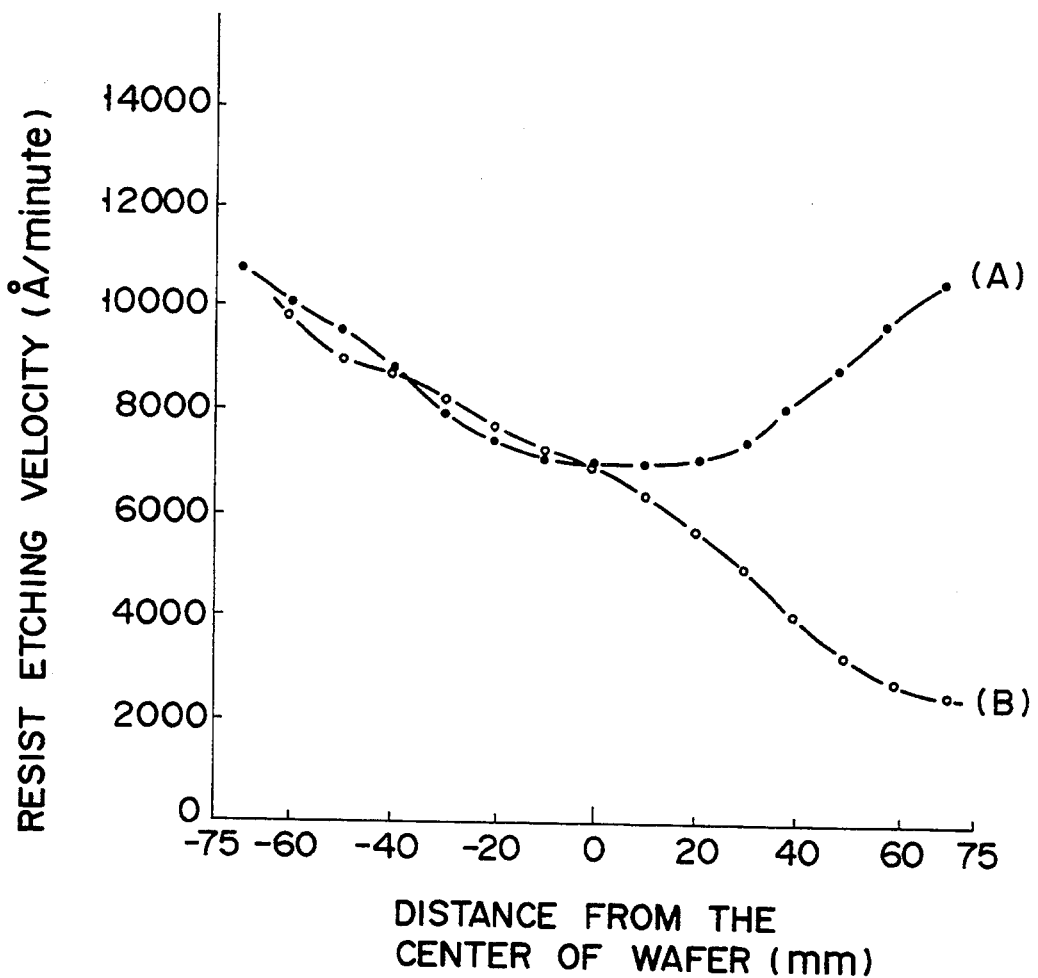
F I G. 4

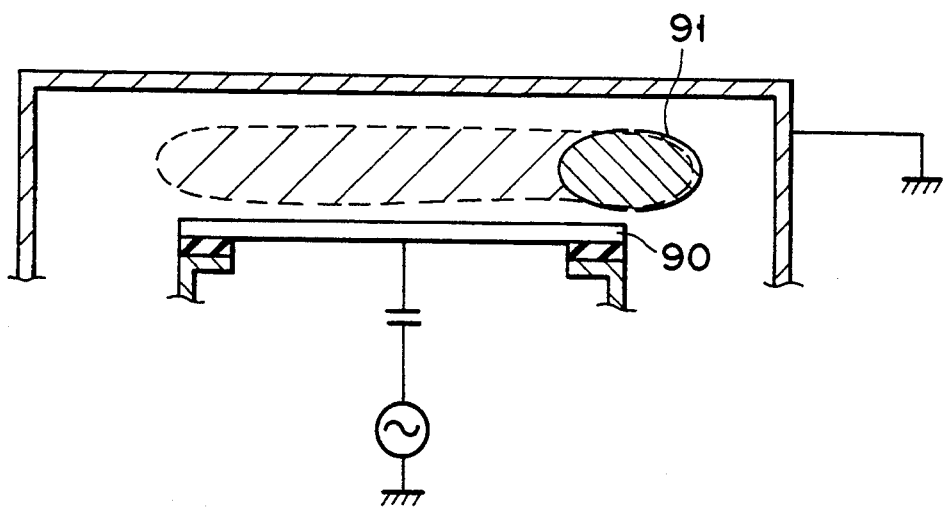
F I G. 5A
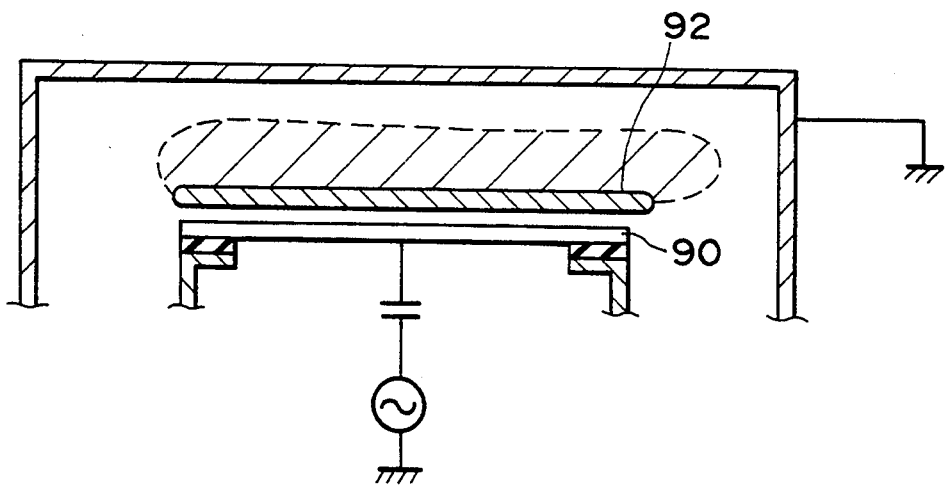
F I G. 5B

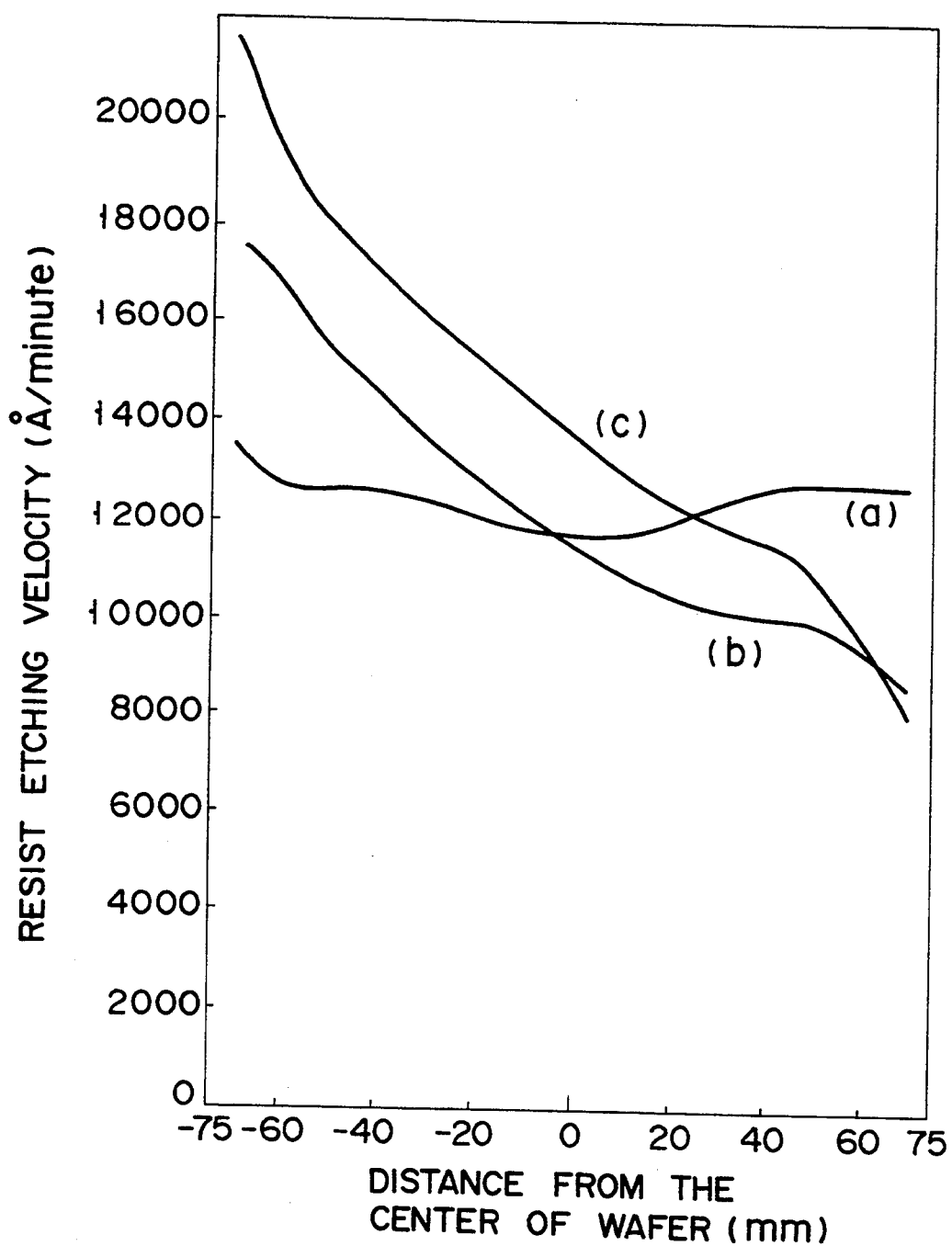
F I G. 6

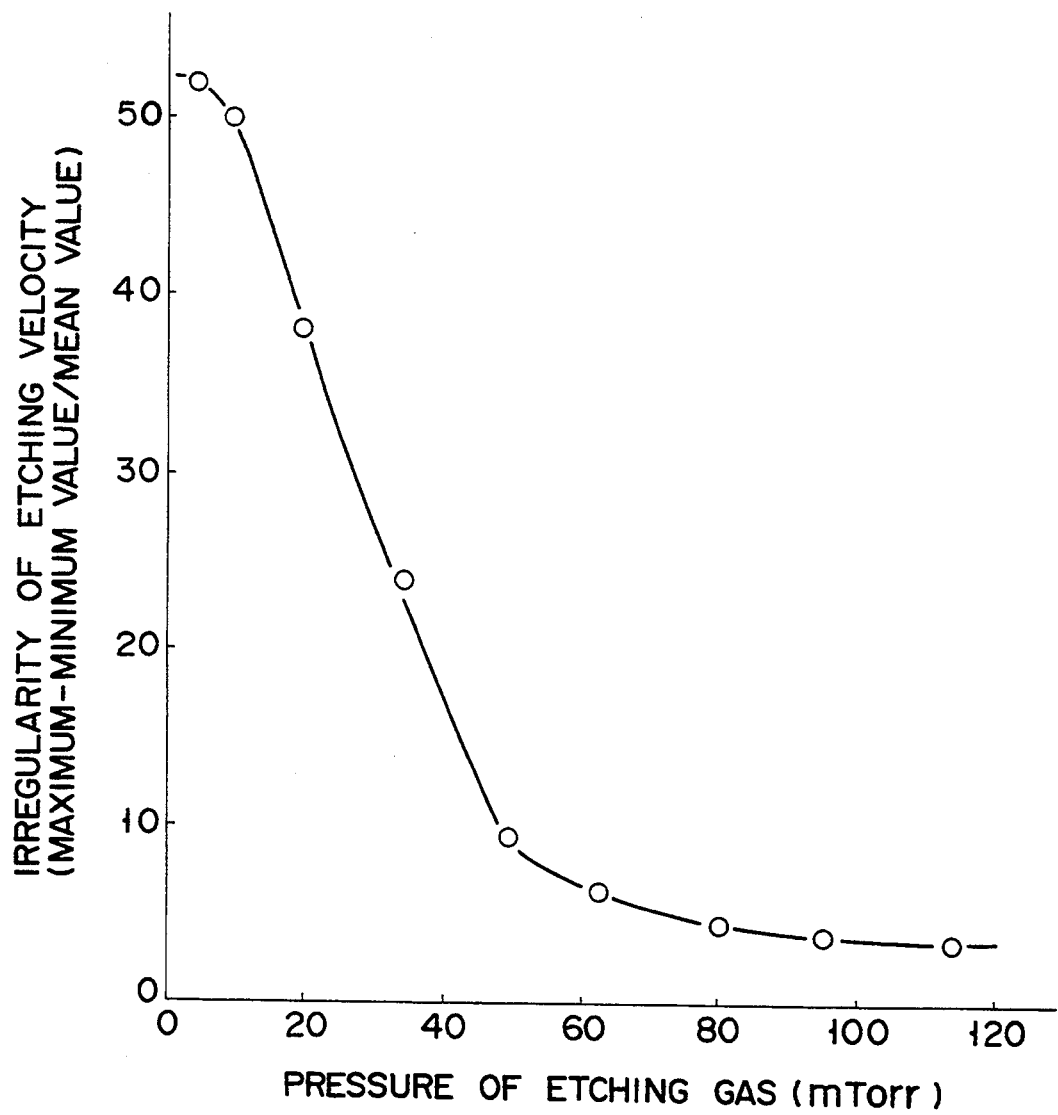
F I G. 7

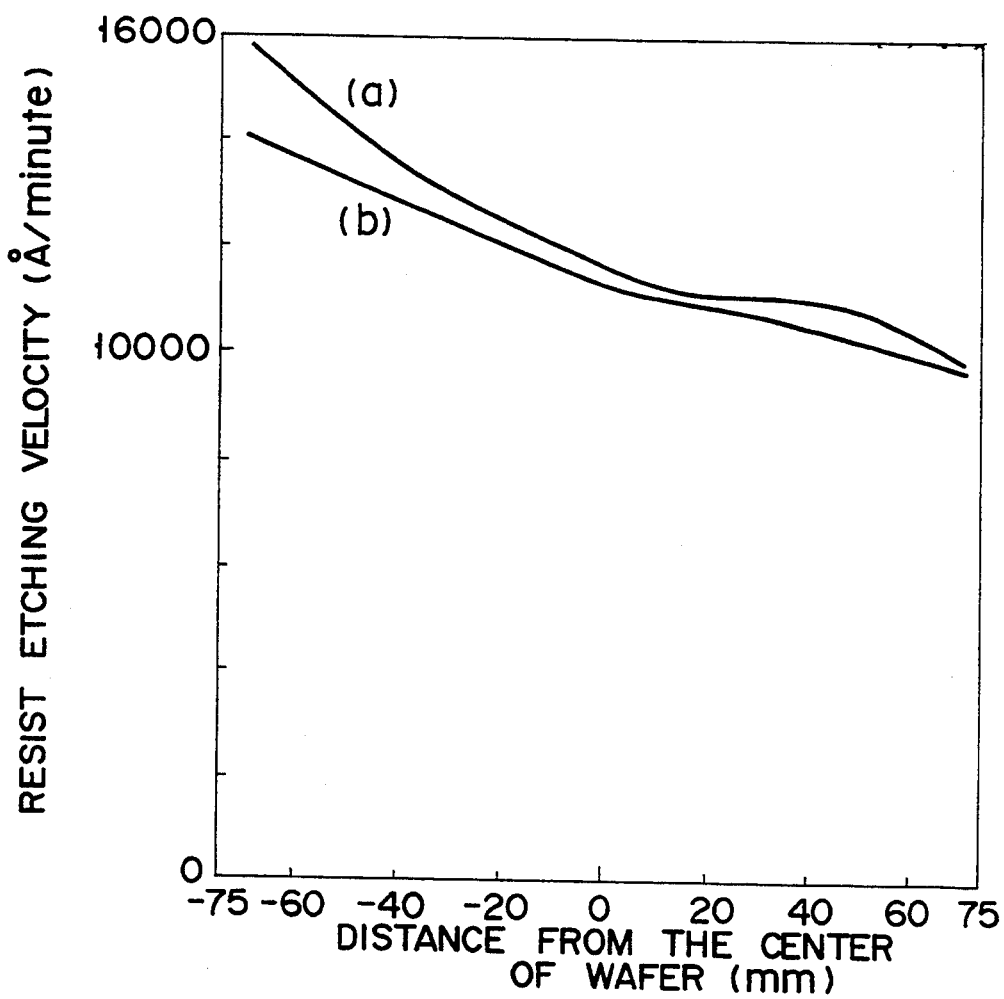
F I G. 8
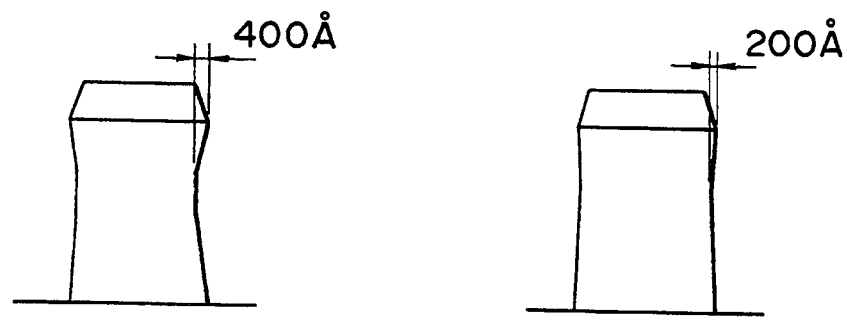
F I G. 9A    F I G. 9B

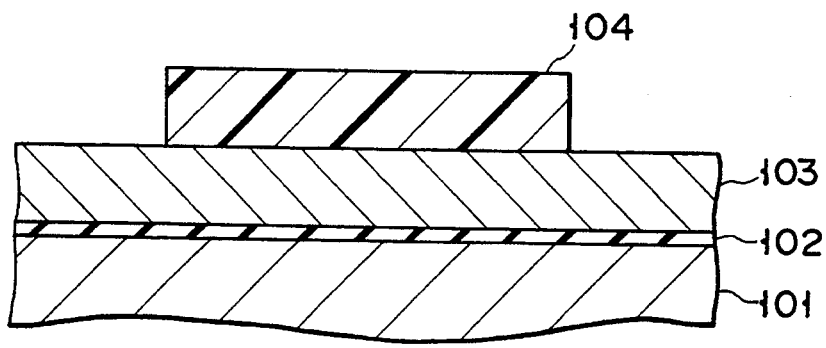
F I G. 10A
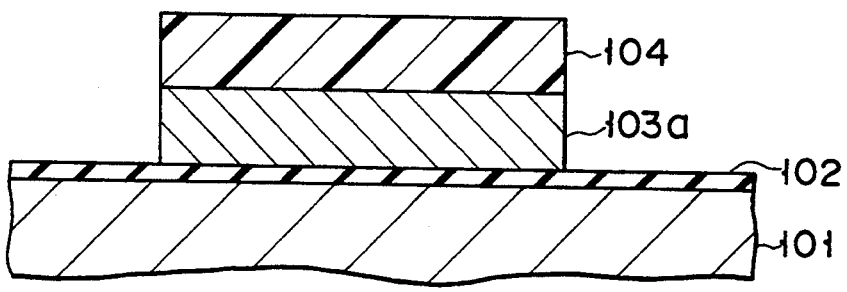
F I G. 10B

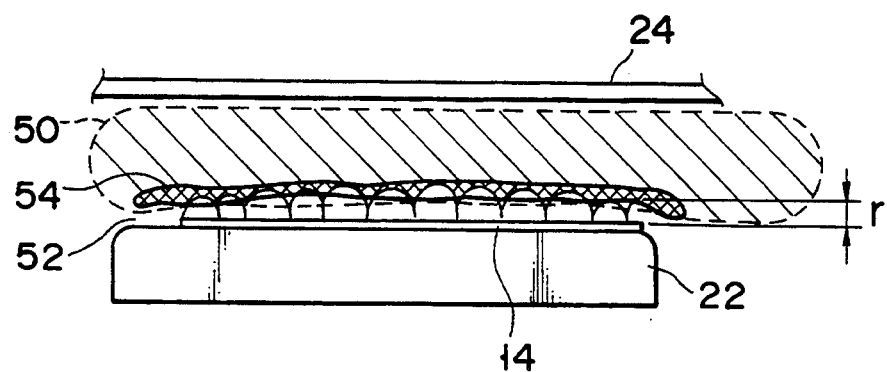
F I G. 12
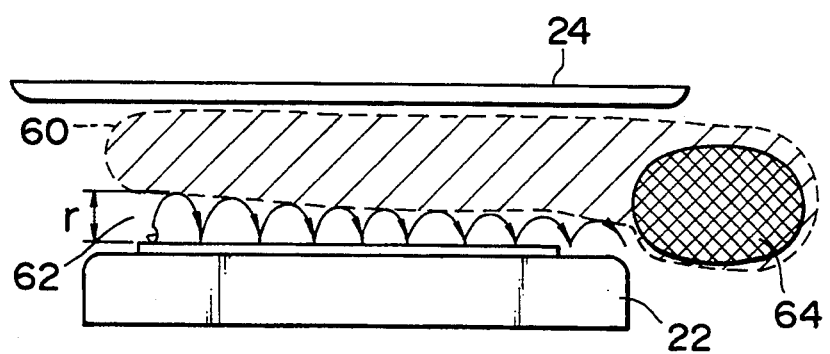
F I G. 13

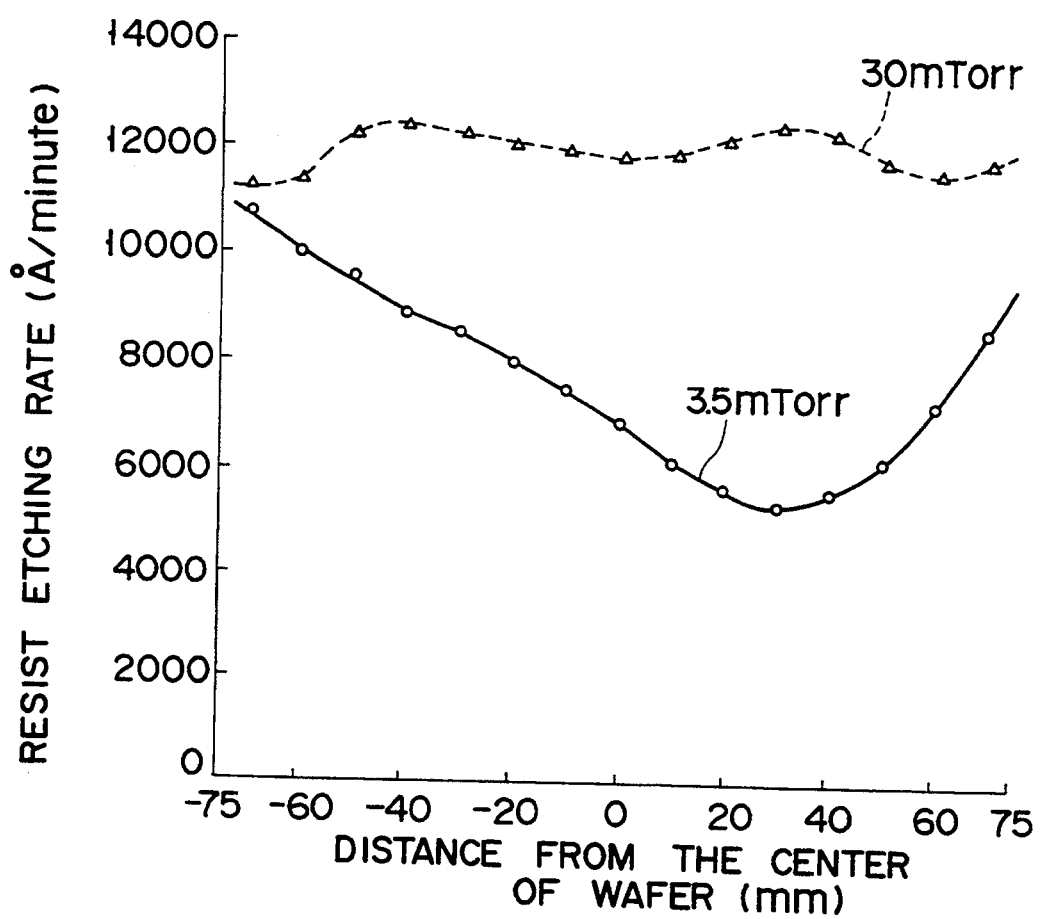
F I G. 14

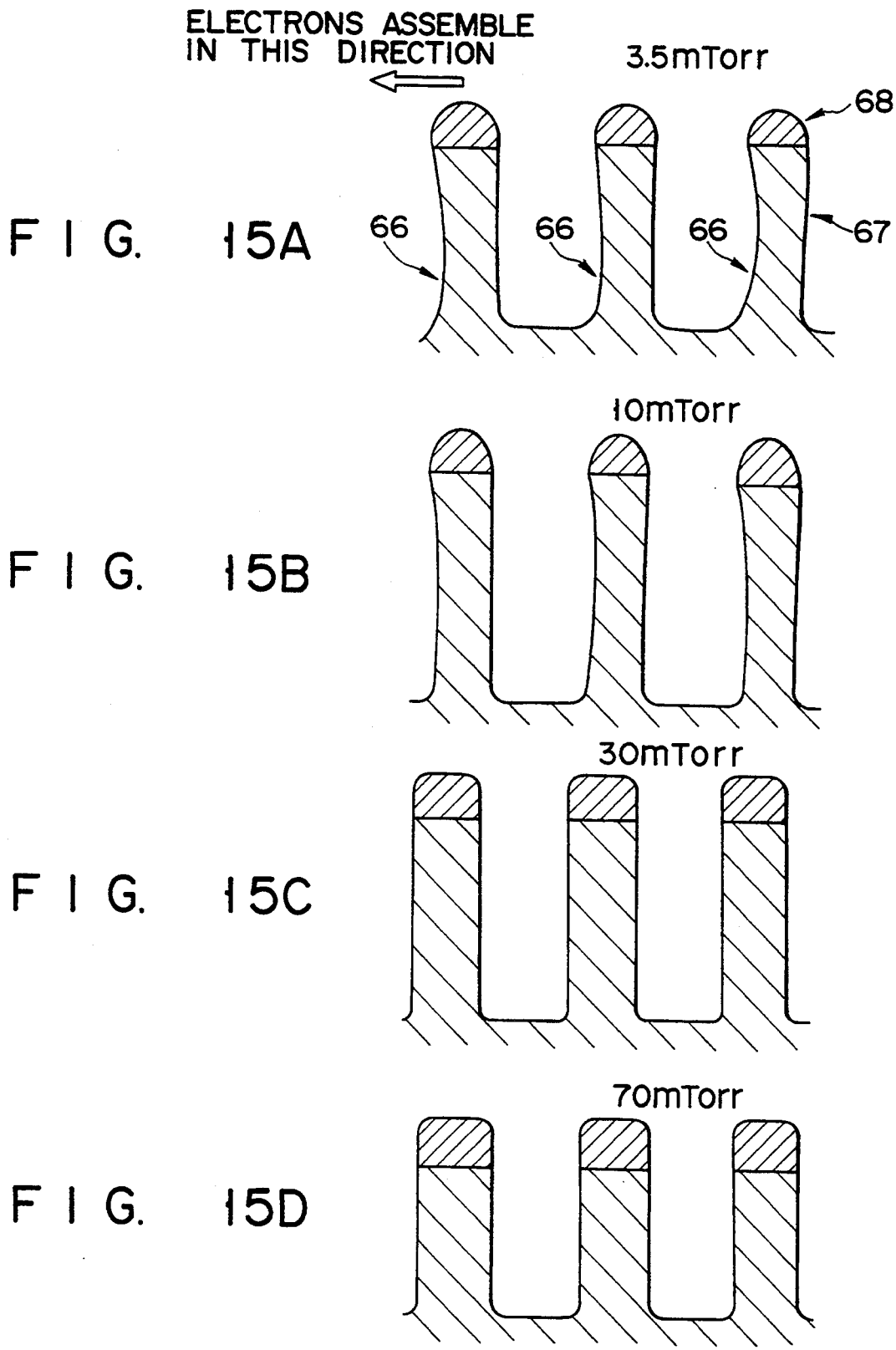

3.5mTorr

10mTorr

30mTorr

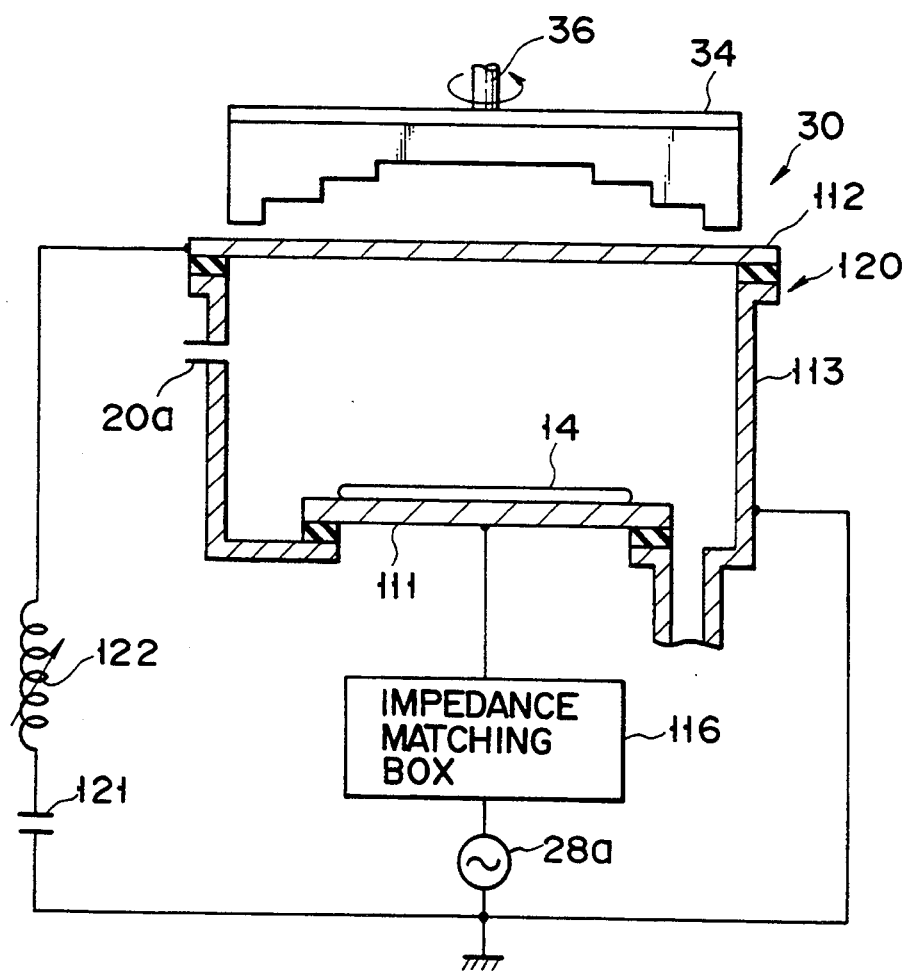
F I G. 21

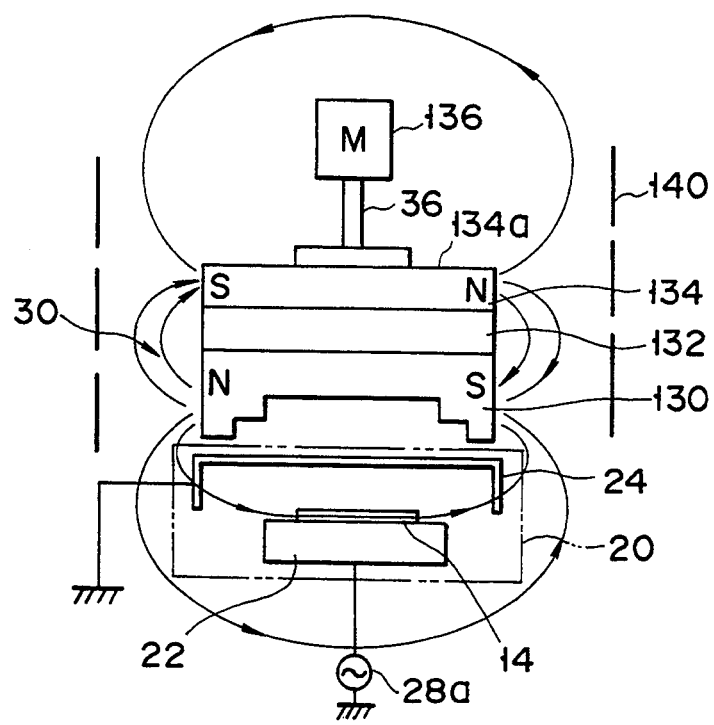
F I G. 22
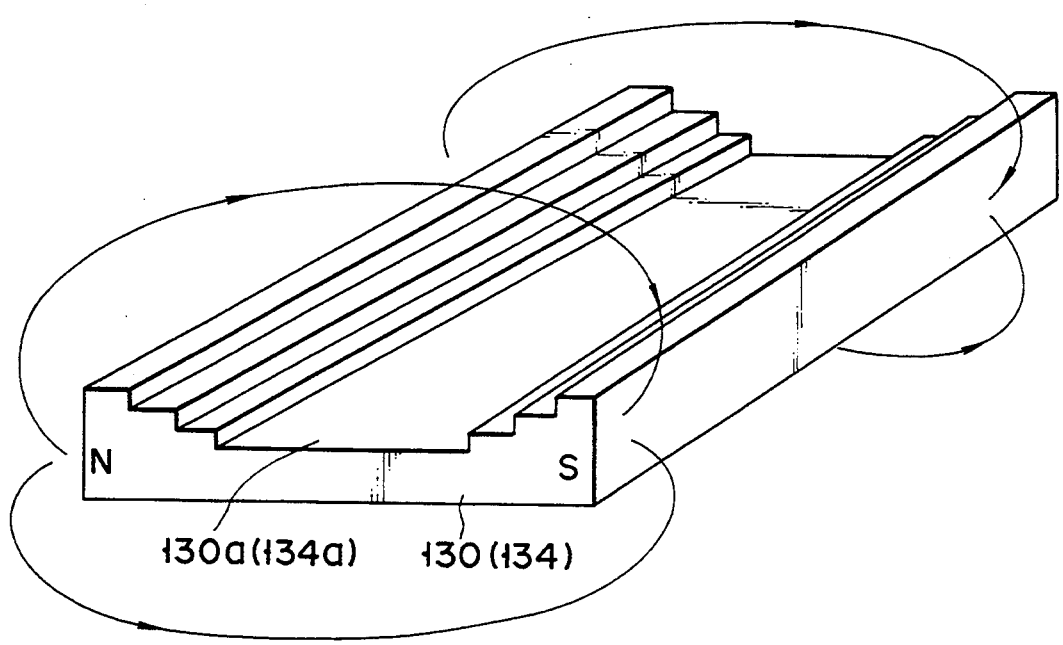
F I G. 23

ATTENUATION OF MAGNETIC FIELD PER DISTANCE

VARIATION OF LEAKED MAGNETIC FIELD AT A PREDETERMINED DISTANCE FROM THE CENTER OF MAGNET

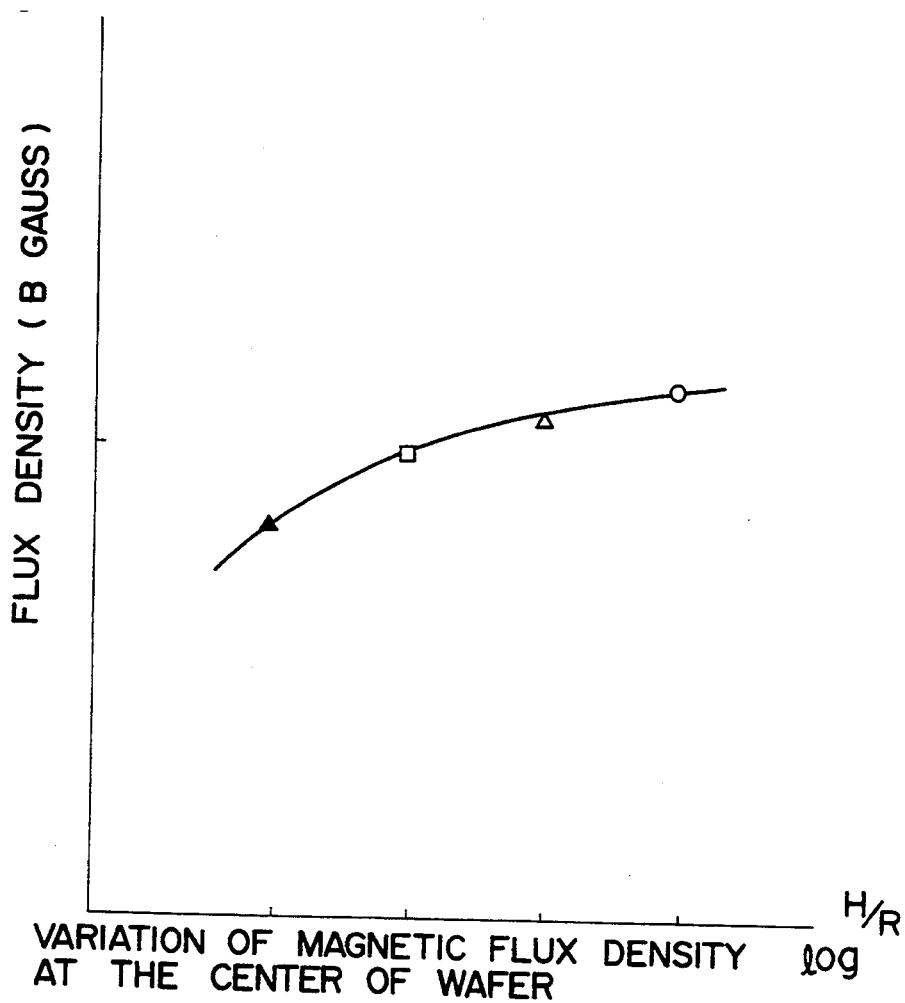
VARIATION OF MAGNETIC FLUX DENSITY AT THE CENTER OF WAFER
F I G. 32
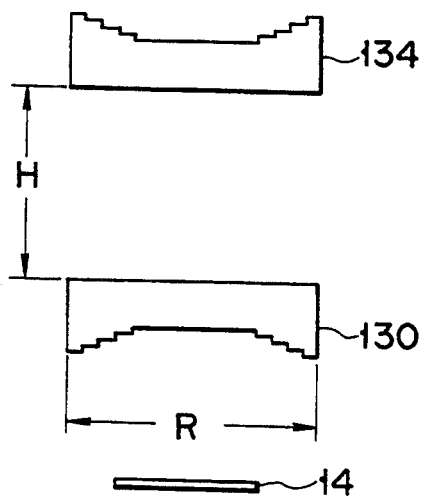
F I G. 33

MAGNETRON PLASMA PROCESSING APPARATUS AND PROCESSING METHOD

BACKGROUND OF THE INVENTION

1. Field of the Invention

The present invention relates to a magnetron plasma processing apparatus and a method of processing magnetron plasma available for the production of semiconductor integrated circuits.

2. Description of the Related Art

Conventional magnetron plasma etching or dry etching apparata generate an electric field between parallel plane electrodes and a magnetic field orthogonally intersecting the electric field. Such a conventional magnetron plasma etching apparatus executes an etching process against a semiconductor refer by generating plasma with etching gas to process this wafer mounted on one of those plane electrodes.

Normally, in order to promote anisotropy as the typical etching characteristic, such a conventional magnetron plasma etching apparatus cited above executes an etching process by maintaining the internal pressure of vacuum chamber very low like 3.5 m Torr, or 7 m Torr, or 9 m Torr, for example.

Although anisotropy is securely promoted in the course of etching the semiconductor wafer by holding the internal pressure of the vacuum chamber very low as cited above, the etching rate can hardly be maintained at a constant level on the semiconductor wafer. Inventors of the present invention detected that application of such low internal pressure to the etching process of a semiconductor wafer resulted in the generation of a faulty wafer shape, in the form of a bent or gouged configuration. After exploration of the cause of these faulty symptoms, the inventors confirmed that, when such low pressure was applied, due to least probability of generating collision between ions, the plasma remained in low density, and thus resulted in the generation of a comparatively thick plasma sheath (in other words, a dark sphere of plasma) in the neighborhood of the semiconductor wafer.

Based on this discovery, the inventors further detected that, after being released from the semiconductor wafer as a result of generating collision between electrons, secondary electrons performed cyclonic movement according to the relationship between the electric field and magnetic field, and then, even when the secondary electrons were supposed to traverse the plasma, the secondary electrons shifted themselves to one side without hitting against gas seeds, but instead, the secondary electrons moved themselves into the comparatively thick plasma sheath without traversing the plasma at all, and finally, accumulated on the peripheral edges of the semiconductor wafer.

Taking these symptoms into account, the inventors finally confirmed that the plasma could not maintain uniform density in the neighborhood of the semiconductor wafer, and yet, accumulated electrons adversely affected the etching characteristic.

Such a conventional magnetron plasma etching system has another technical problem to solve. Concretely, due to uneven intensity and direction of magnetic field, the etching process cannot properly be executed at minimum etching speed, and in addition, ions cannot hold own their directivity constant, but these ions are obliged to obliquely enter into the wafer substrate, thus eventually making it difficult to properly execute the etching process with satisfactory anisotropy.

Although not strictly being defined, a variety of physical reasons are assumed to adversely affect the etching process to result in the poor formation of the semiconductor wafer. More particularly, the line of magnetic force formed in the peripheral edges of the semiconductor wafer cannot be formed in parallel with the upper surface of the semiconductor wafer, but instead, it turns into a loop. Since the electric field remains comparatively less in the plasma, electrons are subject to intense influence of magnetic field, and as a result, electrons respectively perform spiral movement with a circle of about 2 mm across by way of surrounding the line of magnetic force. As a result, when the line of magnetic force intersects the semiconductor wafer, electrons obliquely enter into the wafer along the line of magnetic force.

On the other hand, those ions directly being applied to the etching process respectively contain substantial mass, and thus, these ions are rarely subject to deviation of their moving direction otherwise caused by direct influence of magnetic field. Nevertheless, when electrons obliquely enter into the semiconductor wafer substrate during the process, these electrons merely collide with one-side wall of the substrate to result in the uneven accumulation of charge on both-side walls, which in turn generates uneven and asymmetrically distributed charge. In consequence, a new electric field is generated on both sides of the semiconductor wafer substrate, which then affects ions so that ions are obliged to move in deviant directions. This eventually results in degraded anisotropy in the formation of semiconductor wafers.

To solve this problem, if a plurality of permanent magnets were provided on both ends of parallel plane electrodes consisting of substrate electrodes and opposite electrodes, the upper surface of the semiconductor wafer will be provided with a specific magnetic field which is approximately parallel. In this case, the conventional magnetron plasma processing apparatus can generate such a semiconductor wafer having satisfactory anisotropy. On the other hand, when disposing a plurality of permanent magnets on both sides of parallel plane electrodes, because of the positionwise relationship, it is extremely difficult for the system to rotate those permanent magnets. Furthermore, no art can materialize uniform etching effect without rotating those permanent magnets. Furthermore, in order to generate uniform magnetic field on the semiconductor wafer based on the structure cited above, the system needs to provide large size permanent magnets.

There is such a proposed conventional apparatus which disposes coil-like electrodes in the periphery of the vacuum chamber in place of those permanent magnets mentioned above. The proposed apparatus is characteristically capable of rotating the direction of magnetic field by feeding alternate current having phases 90° apart from each other to the two pairs of coils orthogonally intersecting each other.

On the other hand, in order to uniformly feed magnetic field to the whole surface of the semiconductor wafer, these coils must respectively have substantial diameter in proportion to the dimension of the vacuum chamber. In other words, the greater the dimension of the semiconductive wafer, the greater the dimension needed for the coils. This in turn requires the power supply source to increase the power supply capacity.

Furthermore, since the magnetic field intensely affects both the interior and exterior of the chamber including a possibly unwanted domain, the proposed magnetron plasma processing system cannot practically use such electronic elements which are extremely sensitive to magnetism, and yet, the proposed system needs to have an effective means to prevent magnetism from leaking out of the apparatus

SUMMARY OF THE INVENTION

The primary object of the invention is to uniformly level off the etching rate covering the whole surface of the semiconductor wafer under process by evenly generating plasma all over the surface of the semiconductor wafer under process so that the form of the semiconductor wafer completed with the etching process can be improved.

The second object of the invention is to minimize leakage of magnetic field from the magnetron plasma processing apparatus embodied by the invention. To achieve the primary object of the invention, a novel magnetron plasma processing apparatus is provided by the invention, which characteristically comprises the following; a vacuum chamber which stores a semiconductor wafer under process; a pair of parallel electrodes comprising a first electrode which is provided in the vacuum chamber to hold the semiconductor wafer under process and a second electrode which is disposed opposite the first electrode; a gas-supply means which supplies gas to the vacuum chamber; a magnetic-field generating means including a magnetic block provided outside the vacuum chamber on the opposite side of the second electrode and rotatable about an axis normal to the object held by the first electrode; the magnetic block including a surface facing the vacuum chamber, the surface having magnetic poles whose polarities are opposed to each other and a recess positioned between the poles; and a power-supply means which feeds power to either of the first and second electrodes to generate discharge between these parallel plane electrodes.

Likewise, to achieve the primary object of the invention, another magnetron plasma processing apparatus is hereby provided, which characteristically comprises a vacuum chamber which stores a semiconductor wafer under process; a pair of parallel electrodes comprising a first electrode which is provided in the vacuum chamber to hold the semiconductor wafer under process and a second electrode which is disposed opposite the first electrode; a third electrode surrounding the first electrode and grounded; a gas-supply means which feeds gas to the vacuum chamber; a magnetic-field generating means which is disposed to the side opposite from the first electrode opposite the second electrode and generates magnetic field between these parallel electrodes; and a power-supply means which feeds power to either of the first and second electrodes to generate discharge between those parallel electrodes described above.

Furthermore, to achieve the primary object of the invention, another magnetron plasma processing apparatus is provided, which characteristically comprises a vacuum chamber which stores a semiconductor wafer under process; a magnetic-field generating means substantially being in parallel with the upper surface of the semiconductor wafer under process; a plasma-generating means which generates electric field orthogonally intersecting the upper surface of the semiconductor wafer under process, and yet, generates plasma in the vacuum chamber; and an internal pressure adjusting means which properly adjusts pressure inside of the vacuum chamber in a range from 10 m Torr to a maximum of 100 m Torr.

To achieve the primary object of the invention, a novel method of executing magnetron plasma processing operation is also provided by the invention, which includes the following sequential steps of feeding gas to a vacuum chamber, followed by adjusting pressure of the supplied gas to a predetermined degree above 10 m Torr; mounting a semiconductor wafer on the first electrode secured inside of the vacuum chamber; generating a magnetic field substantially in parallel with the upper surface of the semiconductor wafer in the neighborhood of the first electrode by means of a magnetic-field generating means which is disposed on the back of the second electrode opposite the first electrode; and generating electric field between the first and second electrodes to generate discharge before eventually processing the semiconductor wafer with plasma.

To achieve the second object of the invention, a novel magnetron plasma processing apparatus is hereby provided, which characteristically comprises a vacuum chamber which stores a semiconductor wafer under process; a gas-supply means which supplies gas to the vacuum chamber; a plasma-generating means which generates electric field by way of orthogonally intersecting the upper surface of the semiconductor wafer under process to generate plasma in the vacuum chamber; a magnetic-field generating means which generates magnetic field substantially parallel with the upper surface of the semiconductor wafer under process held in the vacuum chamber; a compensatory magnetic-field generating means which is opposite the vacuum chamber, wherein said compensatory magnetic-field means generates magnetic field in a direction opposite from that generated by said magnetic-field generating means; and a means for rotating the magnetic-field generated by said magnetic-field generating means and said compensatory magnetic-field generating means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a graph of the relationship between magnetic field generated by permanent magnets and the etching characteristic;

FIGS. 5A and 5B respectively are schematic illustrations of discharge generated between electrodes;

FIG. 6 is a graph of the distribution of the etching speed in the presence of 50 m Torr of gas pressure;

FIG. 7 is a graph of the relationship between the uniformity of the etching speed and the gas pressure when rotating permanent magnets;

FIG. 8 is a graph of the distribution of the etching speed in the direction orthogonally intersecting the line of magnetic force when securing permanent magnets;

FIGS. 9A and 9B respectively are lateral views of the samples etched by rotating permanent magnets;

FIGS. 10A and 10B respectively are sectional views of gate electrodes of MOS LSIs processed by the etching method embodied by the invention;

FIGS. 12 and 13 are schematic illustrations of the distribution of plasma sheath generated between electrodes;

FIG. 14 is a graph of the distribution of the etching speed on a semiconductor wafer after varying gas pressure inside of the vacuum chamber;

FIGS. 15A through 15D respectively are sectional views showing a gouged condition of the etched domain caused by varied gas pressure inside of the vacuum chamber;

FIG. 21 is a schematic block diagram of the magnetron plasma processing (etching) apparatus according to the third embodiment of the invention;

FIG. 22 is a lateral view of a modified permanent magnet introduced to the magnetron plasma processing apparatus shown in FIG. 21;

FIG. 23 is a perspective view of a magnetic element composing a permanent magnet;

FIG. 32 is a graph of the relationship between the distance between magnet elements and the magnetic flux density in the center of the semiconductor wafer; and FIG. 33 is a lateral view of a permanent magnet explanatory of FIG. 32.

DETAILED DESCRIPTION OF THE PREFERRED EMBODIMENTS

Referring now to the accompanying drawings, the magnetic plasma processing apparatus and the related method embodied by the invention are respectively described below.

Figure 1:
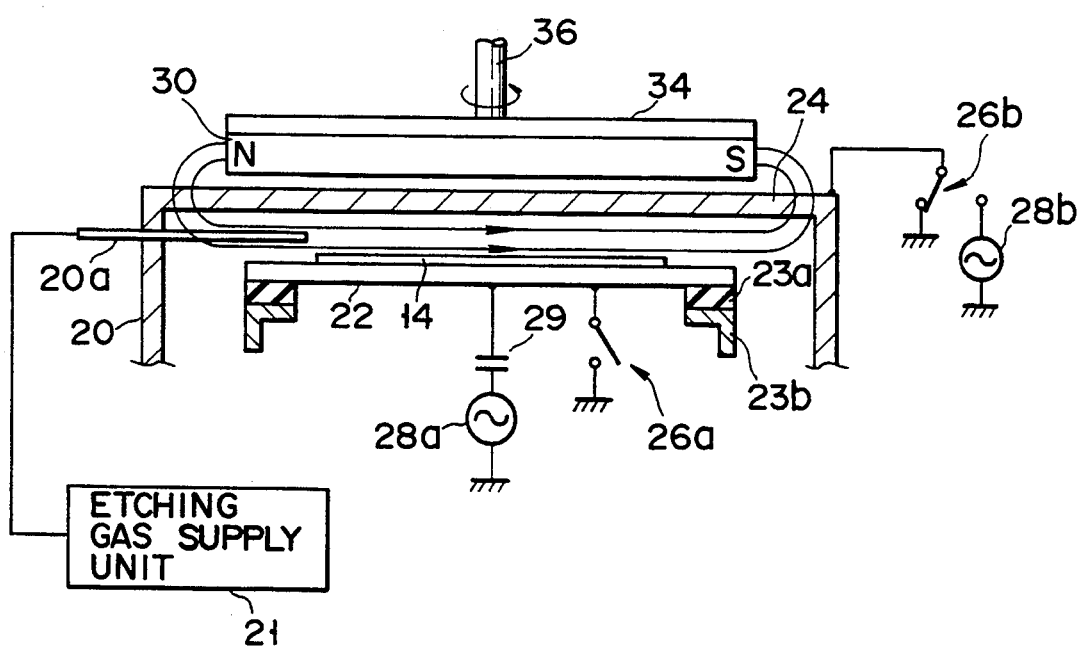
FIG. 1 is a schematic diagram of the magnetron plasma processing apparatus (which is substantially an etching apparatus) according to the first embodiment of the invention.

FIG. 1 schematically designates a block diagram of the dry-etching apparatus which is substantially the magnetic plasma processing apparatus according to the first embodiment of the invention. The dry-etching apparatus is provided with a vacuum chamber 20 which is capable of materializing vacuum up to $10^{-6}$ Torr for example. The vacuum chamber 20 is internally provided with a bottom electrode 22 which is mounted on a supporting table 23b via an insulator 23a.

An upper electrode 24 is substantially composed of the top wall of the vacuum chamber 20, where the upper electrode 24 is disposed above and in opposition to the bottom electrode 22. The bottom electrode 22 and the upper electrode 24 in conjunction make up a unit of parallel plane electrodes. A thermo-control means (not shown) and an electrostatic chuck (not shown) are respectively provided for the bottom electrode 22. The electrostatic chuck secures a semiconductor wafer 14 on the upper surface of the bottom electrode 22, where the difference of temperature between the secured semiconductor wafer 14 and the bottom electrode 22 is held at a maximum of 5° C. The superficial area which does not secure the semiconductor wafer 14 is covered by conductive material or insulating material having less than 1 mm of thickness. An inlet 20a is provided for the vacuum chamber 20 to introduce etching gas, which is connected to an etching-gas supply unit 21. In other words, the etching-gas supply unit 21 supplies etching gas containing predetermined pressure to the interval between the parallel plane electrodes.

The bottom electrode 22 is connected to a high-frequency power-supply source 28a via a capacitor 29 and grounded via a switch 26a. The upper electrode 24 is selectively connected to the ground or the high-frequency power-supply source 28b via a switch 26b. Therefore, the magnetron plasma processing apparatus of the first embodiment of the invention can execute a plasma etching process by optionally selecting either the anode-coupling (PE) system or the cathode-coupling (RIE) system. Concretely, when connecting the high-frequency power supply source 28b to the upper electrode 24 and grounding the bottom electrode 22, the magnetron plasma processing apparatus of the first embodiment operates itself based on the anode-coupling system. Conversely, when connecting the high-frequency to the bottom electrode 22, the magnetron plasma processing apparatus operates itself based on the cathode-coupling system. A permanent magnet 30 having a stepped recess 32 is held by an aluminium-made non-magnetic magnet holder 34 above the upper electrode 24. The permanent magnet 30 is subject to rotation by the force driven by a non-magnetic rotary shaft 36 connected to the magnet-holder 34.

Figure 2A:
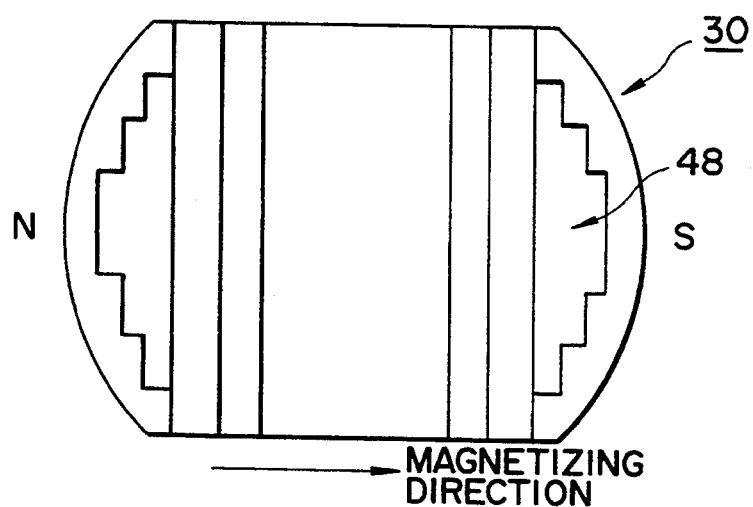
FIGS. 2A and 2B respectively are a view of the bottom surface (FIG. 2A) and a vertical sectional view (FIG. 2B) in the longitudinal axial direction of a permanent magnet shown in FIG. 1.
Figure 2B:
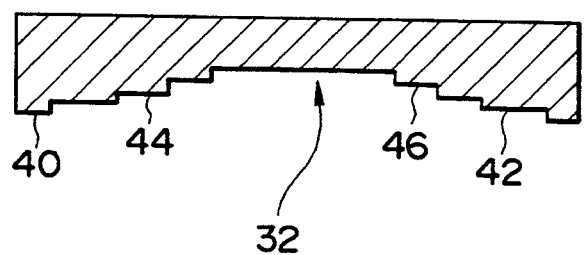

Next, referring to the bottom view and the sectional view shown in FIGS. 2A and 2B, structure of the permanent magnet 30 is described below.

A pair of stepped recesses 32 are provided on the surface of the permanent magnet 30 which is opposite from the upper electrode 24, where these stepped recesses 32 respectively make up the lateral walls of the permanent magnet 30 on both sides in the magnetizing direction. These stepped recesses 32 are respectively provided with stepwise depth which is deeper in the direction of the center from both sides. As shown in FIG. 2A, the permanent magnet 30 is of elliptical shape, which is magnetized in the longitudinal axial direction, where the S-pole is formed on the external surface of an end of the magnetizing direction, whereas the N-pole is formed on the external surface of the other end. Structurally, the permanent magnet 30 introduced to the magnetron plasma processing apparatus of the first embodiment is composed of a number of ferrite pieces which are tightly assembled into the shape shown in FIG. 2 before being magnetized in the longitudinal axial direction.

The first embodiment provides 4-step wall members on both sides of the stepped recesses 32 of the permanent magnet 30 including the first wall member 40, the second wall member 42, the third wall member 44, and the fourth wall member 46, which respectively have differential steps in the vertical direction. Of these, as shown in FIG. 2A, stepwise notch 48 is provided for the outermost first wall member 40 so that distance between the first wall members 40 and 40 can be contracted in the direction of both sides of the longitudinal axis of the permanent magnet 30. These first wall members 40 and 40 are respectively provided in order to prevent the intensity of magnetic field from declining when the permanent magnet 30 leaves the longitudinal axis in the widthwise direction. These first through fourth wall members are respectively provided with magnetic poles inverse from that of the back surface of the permanent magnet 30.

Next, the functional operation of the dry etching apparatus according to the first embodiment of the invention is described below.

As a whole, there are three kinds of line of magnetic force generated in the permanent magnet 30 containing the stepped recesses 32. The first line of magnetic force has substantial curvature and is generated between the inner and outer surfaces of the first wall members 40. The first line of magnetic force is generated in the neighborhood of the tip surface of the first wall members 40 without adversely affecting the magnetic field on the semiconductor wafer 14 which is apart from the surface of the permanent magnet 30 by 52 cm for example.

The second line of magnetic force is generated between the opposite surfaces of those wall members 40 through 46, where majority of the second line of magnetic force is formed in the stepped recesses 32 of the permanent magnet 30, and yet, like the first line of magnetic force, the second line of magnetic force is free from adversely affecting the magnetic field present in the neighborhood of the semiconductor wafer 14.

On the other hand, the third line of magnetic force is generated on the external surface on both sides of the permanent magnet 30 in the magnetizing direction, thus generating magnetic field at a position opposite from the semiconductor wafer 14. The drying etching apparatus according to the first embodiment makes use of the third line of magnetic force in the form of parallel magnetic fields against the semiconductor wafer 14.

When electrons spin themselves by way of pivoting the third line of magnetic force and then fly in the tangential direction, electrons symmetrically enter into grooves of the wafer under process, thus achieving an etching process with satisfactory anisotropy. In particular, inventors confirmed that satisfactory etching process with improved anisotropy was achieved by generating the third line of magnetic force in parallel with the dark discharge domain (which is substantially sheath region) generated in the neighborhood of the wafer 14. Furthermore, inventors confirmed that the dry etching apparatus based on the first embodiment of the invention securely maintained flux density substantially at 100 G on the whole surface of the wafer 14 by applying the permanent magnet 30 made from inexpensive ferrite pieces, and yet, the apparatus securely generated parallel magnetic field which was intense enough to execute the predetermined magnetron etching process.

Furthermore, since the magnetron etching apparatus of the first embodiment of the invention has the permanent magnet 30 installed on the back of the upper electrode 24, the permanent magnet 30 can be set to a specific position apart from the position which is solely available for loading and unloading the wafer 14 into and out of the magnetron etching apparatus. This in turn permits manufacturers to easily introduce a useful structure capable of rotating the permanent magnet 30. In this way, the magnetron etching apparatus of the first embodiment can rotate the parallel magnetic field on the upper surface of the wafer 14 by rotating the permanent magnet 30. As a result, the intensity of the parallel magnetic field can uniformly be distributed on the whole surface of the wafer 14, thus making it possible for the magnetron etching apparatus of the first embodiment to achieve the uniformity of the etching rate on the whole surface of the wafer 14.

The first embodiment of the invention does not restrain the scope of the recesses formed in the permanent magnet 30 solely to the four-step recesses 32, but single-step recesses may also be made available provided that the permanent magnet 30 be of modest dimension. However, according to the result of trials executed by inventors, it was confirmed that the provision of multiple-step recesses was by far advantageous to generate uniformly parallel magnetic field compared to the provision of single or double step recesses. It is therefore probable that the provision of multiple-step recesses securely promotes the effect of confining the first and second lines of magnetic force in the neighborhood of the permanent magnet 30 or in those multiple-step recesses 32, thus generating uniformly parallel magnetic field. Furthermore, the first embodiment does not always restrain the scope of the recess in the permanent magnet 30 solely to those which are subject to the stepwise change of depth of the recesses, but the first embodiment may continuously vary the depth of the recesses by providing a sloped inner surface of the recesses. However, taking the processing convenience into account in the case of assembling small ferrite pieces to compose the permanent magnet 30, manufacturers can more easily produce the permanent magnet 30 incorporating stepped recesses.

Next, taking resist etching in the multiple-layer resist formation process for example, the method of executing the etching process against semiconductor wafer 14 by applying the magnetron plasma etching apparatus embodied by the invention is described below.

The multiple-layer resist formation process is substantially a means for preserving extremely high lithographic precision on the unlevelled surface of the substrate comparable to the lithographic precision on a plane. The triple-layer resist formation process is typical of the multiple-layer resist formation process. Initially, a substrate surface with stepwise differential levels is coated with resist to level off the surface once. Next, an intermediate layer composed of inorganic compound film like "spin-on-glass (SOG)" is formed on the level surface. Next, predetermined patterns are thermally provided by applying a conventional lithographic process. Next, the predetermined patterns are eventually formed by sequentially etching the SOG film and the resist by applying a reactive ion etching process.

Figure 3A:
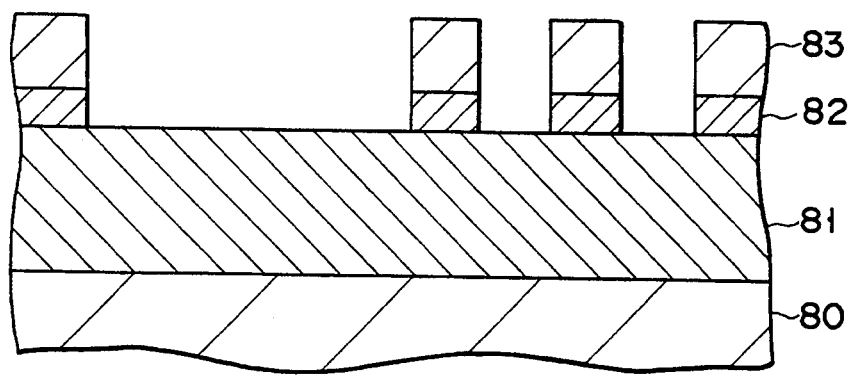
FIGS. 3A through 3C respectively are sectional views showing aspects of resist etching in the multi-layer resist forming process to explain the magnetron plasma processing method (which is substantially an etching method) according to an embodiment of the invention.

As shown in FIG. 3A by means of the sectional view of the wafer under process, the semiconductor wafer 14 made available for the first embodiment comprises triple layers built on the substrate 80 including the first resist layer 81, the etching-completed SOG layer 82, and the top resist layer 83.

Initially, the inventors supplied oxygen containing constant pressure into the vacuum chamber 20 of the dry etching apparatus shown in FIG. 1, and then induced discharge by applying the cathode-coupling system after feeding 13.56 MHz of RF power to the bottom electrode 22 mounting the semiconductor wafer 14 before executing a predetermined etching process.

First, in order to make sure of the relationship between magnetic field generated by the permanent magnet 30 shown in FIG. 1 and the etching characteristic, inventors analyzed the distribution of the etching velocity by holding the permanent magnet 30 still. FIG. 4 graphically designates the distribution of the etching velocity when applying 3.5 m Torr of oxygen pressure. More particularly, FIG. 4A graphically designates the distribution of the etching velocity in the direction of the line of magnetic force, in which the etching velocity is almost symmetrically distributed despite slight rise in the peripheral regions against the center position. On the other hand, the etching velocity in the direction orthogonally intersecting the line of magnetic force shown in FIG. 4B is asymmetrically distributed with the indication of monotoneous increase in the leftward direction.

Figure 3B:
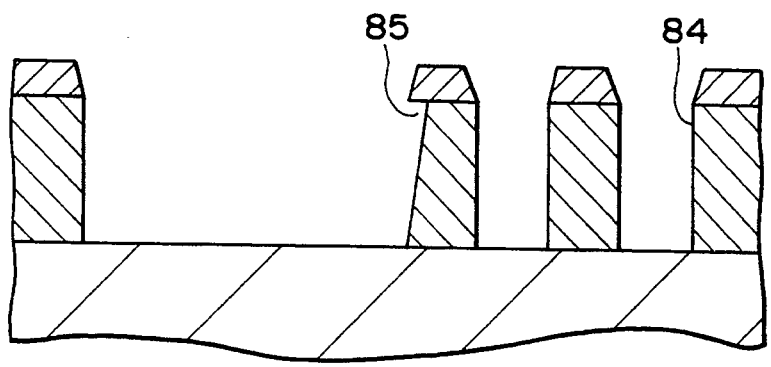

After completing visual analysis of the section of the etched shape, as shown in FIG. 3B, the inventors confirmed that the resist domain section 84 with fine repeated patterns was etched. On the other hand, the other resist domain section 85 facing a broad groove incurred constriction on the side wall which was set in the direction of faster etching velocity. The etching velocity was leveled off by rotating the permanent magnet 30. Nevertheless, the inventors also confirmed that the etching velocity in the center and the peripheral regions of the wafer was not properly leveled off. In particular, the inventors confirmed that the etching velocity was significantly uneven in the peripheral regions of the wafer in contrast with the center. Although the etched shape was symmetrically formed on both sides as a result of the rotation of the permanent magnet 30, the side wall oriented in the faster etching velocity still incurred constriction.

When a magnetron discharge is generated, due to the effect of electric field which is mainly generated between cathode and plasma and the effect of magnetic field orthogonally intersecting the generated electric field, electrons continuously perform cycloidal movement in the direction of orthogonally intersecting the generated electric field and magnetic field. This phenomenon effectively promotes density of plasma relative to the increased rounds of collision between electrons and oxygen molecules. Simultaneously, this phenomenon also generates a gradient of the density of plasma between surfaces of those electrodes in a direction orthogonally intersecting the magnetic field, thus eventually generating uneven etching velocity and asymmetrically etched shape of side wall of the wafer.

Although irregularity of the etching velocity can be eliminated by providing a concentrically circular magnet which permits electrons to follow up circulating movement by closing the route of electrons to perform cycloidal movement, this method still generates unevenness of the etching velocity between the electron route and other domains. Furthermore, such a concentrically circular magnet cannot fully suppress horizontal magnetic field.

As is clear from the above description, the gradient of the density of plasma dominantly causes the etching velocity and the processed shape to lose evenness. Therefore, an advantageous feature of the magnetron etching apparatus embodied by the invention can fully be materialized by effectively suppressing generation of the gradient of the plasma density. Taking this into account, the inventors carried out trials to check the influence of gas pressure on the uniformity of the density of plasma.

By visual analysis of the state of discharge in the direction orthogonally intersecting the line of magnetic force, as shown in FIG. 5A, when the gas pressure was held at 3.5 m Torr, an outwardly projected region beyond an edge of an electrode 90 emitted intense luminance. It is probable that the projected region 91 generated intense luminance as a result of the concentrated effect of electrons which continuously performed drifting movement on the electrode 90. Thus, the inventors again visually analyzed the state of discharge in the direction orthogonally intersecting the line of magnetic force by raising the gas pressure to 25 through 50 m Torr. As a result, the inventors then confirmed that, as shown in FIG. 5B, sheath region 92 having several millimeters of length matching the whole length of cathode generated intense luminance, thus resulting in the sharply improved uniformity of discharge in the cathode. In the presence of the increased gas pressure, gas molecules more frequently collide themselves with those electrons on the electrode 90 on the way of drifting themselves after completing cycloidal movement. In consequence, the density of plasma is stabilized in a relatively short distance to vary the state of discharge.

Figure 3C:
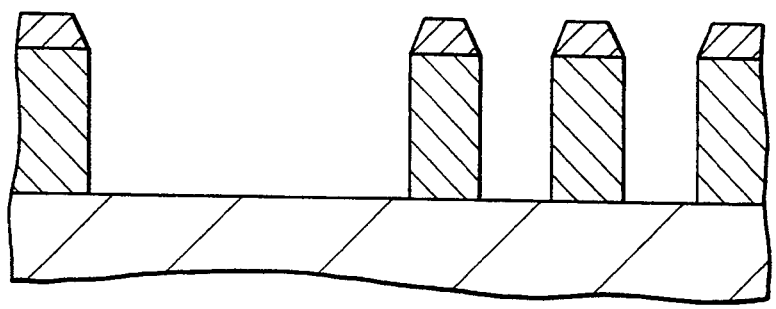

FIG. 3C is a sectional view of the resist shape after completing an etching process by applying the magnetron etching apparatus shown in FIG. 1. Using this apparatus, the inventors executed an etching process against a semiconductor wafer having 150 mm of diameter by feeding 50 sccm of oxygen gas and 600 W of RF power. As a result, constriction on the side wall shown in FIG. 3B was fully eliminated from the one shown in FIG. 3C, thus achieving complete shape with satisfactory anisotropy.

After fully analyzing the relationship between the etched shape and the applied gas pressure, the inventors confirmed that the asymmetrical constriction on the side wall diminished to a practically admissible range, in other words, to a maximum of 5000 Å as a result of applying a minimum of 25 m Torr of gas pressure. The inventors thus confirmed that there was a certain relationship between the visually checked discharge distribution and the constriction generated on the side wall of the wafer. The inventors further discovered that, when applying more than 125 m Torr of gas pressure, since ions actively scattered themselves, constriction noticeably occurred on the side wall independent of the direction and the width of pattern.

FIG. 6 graphically designates the distribution of the etching velocity. Curve (a) designates the direction of the line of magnetic force, whereas curve (b) designates the distribution of the etching velocity orthogonally intersecting the line of magnetic force. There is a constant tendency in the curve (b) to continuously rise in the leftward direction. However, as a whole, the etching effect and the uniformity respectively indicate substantial improvement.

FIG. 7 graphically illustrates the relationship between the uniformity of the etching velocity and the discharge pressure. The difference between the maximum value and the minimum value was divided by the mean value to make up an index for designating the uniformity. It is clear from FIG. 7 that the higher the discharge pressure, the better the uniformity.

In consequence, the inventors confirmed that the magnetron etching apparatus according to the first embodiment of the invention has successfully materialized an etching process which generated improved uniformity of etching velocity and improved shape by processing resist with a minimum of 25 m Torr through a maximum of 125 m Torr of the etching gas pressure.

Next, in order to make sure of the effect of adding light-element gas to the etching, the inventors added helium to oxygen. FIG. 8 graphically illustrates the distribution of etching velocity in the direction orthogonally intersecting the line of magnetic force when applying a stationary magnet. Curve (a) designates the etching gas composed of genuine oxygen, whereas curve (b) designates the etching gas composed of 33% oxygen and 67% helium in blend. These curves respectively designate the results of trial etching executed against semiconductor wafer having 150 mm of diameter by applying 50 sccm of gas flow rate, 50 m Torr of gas pressure, and 400 W OF RF power. As is clear from the comparison between these curves (a) and (b), despite the retarded etching velocity by about 5%, addition of helium gas to oxygen resulted in the noticeably promoted uniformity of the etching effect. While the etching process was underway using genuine oxygen gas by rotating the permanent magnet, evenness of the etching was rated to be about 10%. However, addition of helium to oxygen promoted the etched effect by about 6%.

FIGS. 9A and 9B are schematic sectional views of wafer samples complete with an etching process with the rotation of the permanent magnet. The sectional view shown in FIG. 9A designates symptom of constriction occurred on the side wall by about 400 Å of the width. On the other hand, the sectional view shown in FIG. 9B designates the gouged edge by about 200 Å of the width, which is one-half the dissipated domain shown in FIG. 9A.

Because of negligible mass, even when helium molecules hit against the substrate, physical influence rarely takes place. Furthermore, helium is chemically stable, and therefore, helium does not directly affect the etching reaction. Despite its own inertness, the blend of helium gas and oxygen improves the uniformity of etching effect and the shape of the etched domain. This is probably because helium relaxes influence of the deviant electron density inherent in the magnetron cathode-coupling system which is devoid of a closed circuit as in the dry etching apparatus embodied by the invention.

Next, the dimensions of the wafer and electrodes and the relationship between their dimensions and available materials are described below. The magnetron etching apparatus based on the first embodiment uses electrodes each having a certain radius wider by 15 mm than the wafer having 75 mm of radius. These electrons surrounding the wafer respectively play an important role to promote the evenness of the etching velocity. For comparative example, curve (c) shown in FIG. 6 designates the evenness of the etching velocity in the direction orthogonally intersecting the line of magnetic force when providing electrodes and a wafer with identical dimensions. It is clear from the curve (c) that the gradient of the etching velocity between both ends is extremely differential, thus indicating extremely poor uniformity of the etching velocity.

Next, representing another embodiment of the magnetron plasma processing apparatus of the invention, a method of executing the dry etching of wafer by means of the dry etching apparatus based on the cathode-coupling system to the generation of gate electrode of a MOS LSI device is described below.

FIG. 10A is a schematic sectional view of a wafer etched by the magnetron plasma processing apparatus of the second embodiment of the invention. The wafer shown in FIG. 10A is produced by executing the following sequential processes including formation of silicon dioxide film having 100 Å of thickness on a silicon substrate 101 by applying a thermal oxidation process; deposition of polycrystalline silicon film 103 on the formed silicon dioxide film; doping phosphorus into the deposited polycrystalline silicon film 103; and formation of resist mask 109 on the phosphorus doped polycrystalline silicon film 103. Phosphorus-doped polycrystalline silicon film 103 is widely made available for composing gate electrodes of MOS capacitors and MOS transistors, whereas silicon dioxide film 102 is made available for the dielectric material. When processing the polycrystalline silicon film 103 in the structure mentioned above, uniformity and satisfactory selectivity against the processable shape and the underlaid oxide film 102 are compulsorily demanded. On the other hand, total protection of the insulating characteristic of the gate oxide film 102 against damage is compulsorily demanded. It is well known that, if the density of plasma were unevenly distributed, then, intense electric field is generated in the gate oxide film 102 to easily result in the occurrence of dielectric breakdown.

The inventors also carried out trials to check the relationship between the gas pressure gravely affecting the uniformity of the density of plasma and the resistivity of the oxide film against gas pressure by applying the magnetron etching apparatus shown in FIG. 1 and chlorine etching gas. The inventors supplied 150 W of high-frequency power to an electrode and held the substrate at 0° C. Next, the inventors executed an etching against sample wafers before eventually producing MOS capacitors shown in FIG. 10B. The inventors then measured current-voltage characteristic between the substrate and the gate electrode made from polycrystalline silicon film, and then, checked the faulty resistance rate against applied gas pressure. Table 1 designates the checked result.

TABLE 1

| Pressure ($\times 10^{-3}$ Torr] | 5 | 10 | 20 | 40 | 80 | 100 |
|---|---|---|---|---|---|---|
| Reject rate | 10 | 7 | 3 | 0 | 0 | 0 |

The inventors confirmed about 10% of the reject after applying 5 m Torr ($5 \times 10^{-3}$ Torr) of the gas pressure to the produced MOS capacitors. The reject rate decreased to 7% after applying 10 m Torr of gas pressure. After raising the gas pressure to 40 m Torr and then beyond 40 m Torr, no rejects occurred. This is because the higher the applied gas pressure, the better the uniformity of the plasma density, thus preventing electric field from being generated in the gate oxide film 102 otherwise causing rejects to occur.

After critically checking the occurrence of destruction of gate, the inventors detected that 25 m Torr of gas pressure was the critical limit to prevent the gate electrode from incurring destruction. Like the resist etching process mentioned above, the inventors also confirmed that the uniformity of the etching velocity was also promoted relative to the increase of the applied gas pressure.

The inventors also confirmed that the higher the applied gas pressure, the higher the selectivity against the oxide film from the test result which yielded 20 of the selectivity at 40 m Torr and 35 of the same at 80 m Torr of gas pressure. On the other hand, the inventors also detected that undercut symptom was generated under the mask when the applied gas pressure was in excess of 160 m Torr.

Table 2 designates the relationship between the velocity applied to the etching of polycrystalline silicon film and silicon dioxide film and the substrate temperature. It is clear that the lower the substrate temperature, the better the selectivity. This effect is particularly noticeable when the substrate temperature is below 0° C. In addition, the etched shape is improved by minimizing the undercut symptom.

TABLE 2

| Temperature (°C.) | Polycrystalline silicon film (Å/minute) | $SiO_2$ film (Å/minute) |
|---|---|---|
| −30 | 2,800 | 30 |
| −15 | 3,000 | 50 |
| 0 | 3,000 | 70 |
| 15 | 3,300 | 100 |
| 30 | 3,500 | 110 |

At 100 sccm of $Cl_2$ gas flow;
75 m Torr of gas pressure;
100W of RF power

Next, the inventors replaced genuine chlorine gas with blend of 80% chlorine and 20% helium. After completing tests with the replaced blend gas, the inventors confirmed that, owing to the function of helium ions which horizontally shielded electric field, critical pressure capable of preventing the tested film from incurring destruction lowered to 10 m Torr. Application of helium or any light-element gas component effectively expands the range of pressure to permit the system to process deposited film without incurring destruction.

Like the resist etching process mentioned above, the dimension of the electrodes gravely affects the uniformity of the etching velocity.

Figure 11:
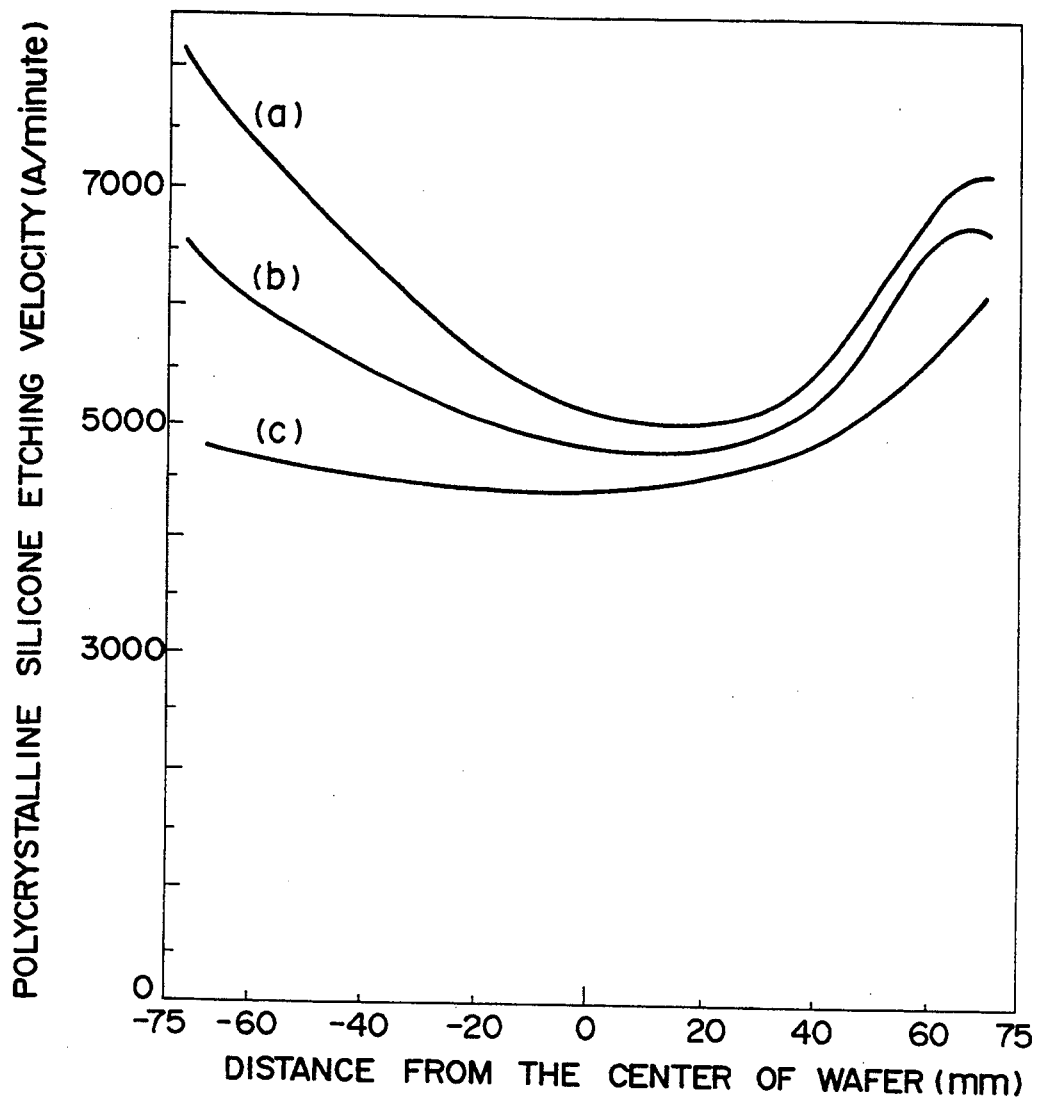
FIG. 11 is a graph of the etching speed in those cases when those electrodes having a variety of dimensions are introduced to the etching apparatus shown in FIG. 1.

FIG. 11 is a graph of the characteristic of the velocity of etching process applied to polycrystalline silicon film on the wafer surface by varying the dimension of those electrodes of the magnetron plasma etching apparatus shown in FIG. 1. Curve (a) designates the distribution of the etching velocity in the direction orthogonally intersection magnetic poles when using those electrodes each having a radius 15 mm wider than that of the wafer. In contrast with the resist etching, the etching velocity is retarded in the leftward direction when electrons assemble themselves. Although the cause of this phenomenon is not yet clear, the gradient is relatively mild. Curve (b) designates the result from the use of those electrodes having the dimension identical to that of the wafer, where the curve (b) indicates degraded uniformity of the etching velocity. Curve (c) designates the result from the use of those electrodes having radius 15 mm wider than that of the wafer. These electrodes were superficially covered with 2 mm thick quartz glass to protect peripheral surface of these electrodes. Curve (c) indicates extremely poor uniformity in contrast with curve (a). This is because, since the applied high-frequency electric field is distributed to both the quartz sheet and the plasma sheath in peripheral edges of those electrodes, electric field in the peripheral edges remains less than that is present on the wafer. The probability of destruction of gate rises in order of curves (a), (c), and (b). Therefore, in order to promote the uniformity of the etching velocity and prevent gate destruction, it is essential for the system to use those electrodes having dimensions greater than that of the wafer under process.

It is desired that the peripheral edges of these electrodes be composed of conductive material like metal or carbon up to the tip surface. If it is necessary to use insulating material to protect the electrodes and prevent the wafer from incurring stain, it is essential for the system to use selected insulating material having a maximum of 1 mm of thickness.

Next, dry etching characteristic of those materials available for composing electrode is described below.

Chlorine gas is effectively applicable to the system for processing gate electrodes of a MOS LSI device using the dry etching apparatus shown in FIG. 1. In addition, the dry etching process can also be achieved to result in the satisfactory shape of etched domain and satisfactory selectivity even when using gas containing bromine like Br2 or HBr in presence of a minimum of $10^{-2}$ Torr of pressure. The amount of deposit can be minimized in the course of the etching process by adding gas containing fluorine like $SF_6$ to bromine gas, and as a result, satisfactory shape of the etched object can eventually be materialized.

Furthermore, the drying etching method embodied by the invention is also effectively applicable to the manufacture of metallic silicide like Wsi, MoSi, or TiSi available for producing low-resistance electrodes. As was proved in the above case, a satisfactory shape of the etched domain and satisfactory selectivity can also be achieved by applying gas containing either chlorine, or bromine, or blend gas containing bromine or fluorine.

Silicon dioxide film serves itself as a mask in the course of executing an etching process against a silicon substrate. Chlorine gas or bromine-contained gas is quite useful to secure selectivity against the masking silicon dioxide film. The inventors confirmed from the test result that, after executing an etching process against a silicon substrate by applying blend gas composed of 90% $Cl_2$ and 10% $SiCl_4$, 10 through 50 m Torr of gas pressure, and 600 W of RF power, 15 of the selective ratio was achieved against the etched silicon dioxide film. The etched shape was dependent on the substrate temperature. The etched shape was confirmed to be vertical when the substrate temperature remained at 70° C. On the other hand, the etched shape was tapered in the forward direction when the substrate temperature remained at 50° C. Conversely, the etched shape was tapered in the backward direction when the substrate temperature was held in excess of 80° C. If the etched shape were tapered in the backward direction, then, film interposing work involves much difficulty, and thus, it is suggested that the etching process be executed while the silicon substrate contains a maximum of 70° C. of temperature.

Although either HBr or $Br_2$ gas can be applied to the process for etching the silicon substrate, since deposit can easily be generated, it is suggested that bromine gas be blended with gas containing fluorine like $SF_6$ for example.

After executing trial production of compound available for wiring material containing aluminium, 1% silicon, and 2% copper by applying blend gas containing 30% (or 70%) $Cl_2$ and 70% (or 30%) $BCl_3$ with 10 through 80 m Torr of pressure and 200 W of RF power, the inventors confirmed that anisotropic etching effect free from undercut symptom was successfully achieved. In the presence of blend gas composed of 70% $Cl_2$ and 30% $BCl_3$, the inventors achieved 6,000 Å/minute of the etching velocity. Furthermore, the apparatus embodied by the invention can also execute an etching process capable of providing satisfactory anisotropy by applying blend gas containing bromine like $Br_2$ or $HBr_2$ for example. In order to properly execute an etching process against aluminium alloy, it is suggested that the substrate be heated to a certain degree above room temperature to prevent residue of the etching process from occurrence.

The apparatus embodied by the invention can also use $CHF_3$ gas to execute an etching process against insulating materials including silicon dioxide film, phosphorus-added silica glass, and boron-phosphorus added silica glass available for insulation. Table 3 designates the relationship between the etching condition, etching velocity, and the inclined angle of the side wall of the wafer.

TABLE 3

| Pressure (m Torr) | Temperature (°C.) | Tapered angle (degrees) | Etching velocity (Å/minute) |
|---|---|---|---|
| 5 | 20 | 82 | 3,500 |
| 10 | 20 | 75 | 2,700 |
| 40 | 20 | 67 | 4,100 |
| 5 | 60 | 88 | 3,600 |
| 10 | 60 | 82 | 3,700 |
| 40 | 60 | 75 | 4,200 |

At 50 sccm of $CHF_3$ and 600W RF Power

The inclined angle of side wall tends to become narrow relative to the rise of applied gas pressure and the decrease of substrate temperature. Based on these parameters, angle of incline can optionally be established.

Furthermore, the angle of incline expands when adding $CF_4$ gas, and conversely, the angle of incline contracts when adding $CH_2F_2$ gas. Therefore, when properly adding these gas components, the angle of the inclined side wall can properly be controlled.

In the event that the available gas is compatible with a general formula "$ClHmFn (m+n=2+2)$", it can also be applied to the process for etching silica glass cited above.

As is clear from the above description, when processing resist and polycrystalline silicon film by applying the etching method embodied by the invention, uniformity of the etching velocity can be secured by stabilizing the pressure of etching gas at a minimum of 10 m Torr, and yet, occurrence of abnormally etched shape caused by uneven density of plasma and damage incurring to gate oxide film can respectively be minimized.

The relationship between the applied gas pressure and the uniformity of discharge is not dependent on the kind of gas. In other words, in addition to those embodiments thus far described, the magnetron etching apparatus and the related method of the invention can securely materialized uniform effect of the etching process by applying the identical pressure range based on the relationship between the wafer under process and a variety of etching gas applicable to the process for etching silicon dioxide film using $ClHmFn(m+n=2+2)$ gas or applicable to the etching of monocrystalline silicon film using bromine gas.

Furthermore, addition of helium gas to oxygen or chlorine results in the sharply promoted uniformity of the etching velocity and the shape of the etched domain, thus effectively suppressing destruction of gate electrodes. This useful effect is generated by the degree of the movement of light-element ions. Identical effect can also be generated by addition of hydrogen. Likewise, identical effect can also be generated by applying compound gas containing HCl or HBr whose molecules respectively contain hydrogen.

The description of the above embodiment has solely referred to the examples of processing resist, polycrystalline silicon film, monocrystalline silicon film, metallic silicide, silica glass, and aluminium alloy, respectively. However, the scope of the invention is not merely limited to those materials cited above, but the scope of the invention is also effectively applicable to the fine process of film for the surface of a variety of materials including silica glass, aluminum, aluminum alloy, or copper, or tungsten, or other metals, as well.

Next, the relationship between the gas pressure in the vacuum chamber of the magnetron plasma etching apparatus shown in FIG. 1 and the etching condition is described below.

A line of magnetic force extending itself between those parallel plane electrodes 22 and 24 is generated between external surfaces of the permanent magnet 30 on both sides in the magnetizing direction. Magnetic field containing about 100 G of magnetic entity is generated in a domain adjacent to the wafer 14, where the magnetic field is generated in parallel with the upper surface of the wafer 14 and orthogonally intersects electric field between those parallel plane electrodes 22 and 24. Parallel magnetic field can uniformly be distributed on the whole surface of the wafer 14 by effect of the rotation of the permanent magnet 30. While performing spinning movement by way of pivoting the line of magnetic force of magnetic field in the presence of parallel magnetic field, if electrons fly themselves in the tangential direction, then these electrons enter into the wafer 14 in the vertical direction. This in turn permits the magnetron plasma etching apparatus to properly execute an etching process with satisfactory anisotropic effect against the wafer 14. After generating parallel magnetic field in the plasma sheath generated in the neighborhood of the wafer 14, the inventors confirmed that the apparatus stably executed the etching process by generating satisfactory anisotropic effect.

The magnetron plasma etching apparatus embodied by the invention can achieve those advantageous effects described below by properly establishing gas pressure in the vacuum in a predetermined range from 10 m Torr to a maximum of 100 m Torr. Unlike any conventional etching system using several mTorr of gas pressure gas pressure ranging from 10 m Torr to a maximum of 100 m Torr applied to the etching process with the magnetron plasma etching apparatus of the invention significantly raises the probability of generating collision between ions of the supplied gas component. This in turn strengthens the density of plasma, and therefore, as shown in FIG. 12, thickness of plasma sheath 52 generated on the wafer 14 can be decreased. The wafer 14 discharges the secondary electrons, and then, the discharged secondary electrons fly themselves in the direction orthogonally intersecting both the electric and magnetic fields by way of performing cyclonic movement until hitting against the wafer 14 to cause the wafer 14 itself to further discharge those secondary electrons by an incremental amount. Radius "r" of the cyclonic movement performed by those secondary electrons is determined by the intensity of both the electric and magnetic fields. If the plasma domain were closer to the wafer 14 then the radius "r", then those secondary electrons collide themselves with gas component of plasma, thus generating ionization. In consequence, the thinner the thickness of the plasma sheath 52, the greater the ionizing effect that can be secured. Based on this reason, as shown in FIG. 12, the apparatus can securely generate domain 54 containing intense density of plasma on the whole surface of the wafer 14.

The magnetron plasma etching apparatus embodied by the invention can securely promote the etching rate itself and the uniformity of the etching rate by densely generating plasma domain 54 on the whole surface of the wafer 14.

As shown in FIG. 13, the plasma sheath has substantial thickness when several mTorr of gas pressure are present in the vacuum chamber, and as a result, those secondary electrons performing cyclonic movement cannot often traverse plasma domain 60 on the sheath 62. As a result, as shown in FIG. 13, those secondary electrons assemble themselves in specific region 64 around the peripheral edges of the wafer 14. This in turn strengthens the plasma density around the peripheral edges of the wafer 14. This is the probable cause of degrading uniformity of the etching rate in this sphere.

FIG. 14 graphically designates the distribution of the etching rate on the wafer. The etching rate remains high and stably even when 30 m Torr of gas pressure is applied. On the other hand, etching rate remains low and the uniformity is significantly degraded when merely applying 3.5 m Torr of gas pressure.

Next, the extent of the improvement of the shape of the etched wafer component in correspondence with the gas pressure in the vacuum chamber is described below.

FIGS. 15A through 15D respectively designate the gouged symptom generated by applied gas pressure. Electron-assembled domain 64 is shown to the left. When 3.5 m Torr of gas pressure is applied, a gouged region is generated on a part facing the electron-assembled domain 64. Probably, this is because certain beams emitted from the electron-assembled domain 64 hit against the gouged region. On the other hand, when 10 m Torr of gas pressure is applied, the gouging symptom rarely takes place. The inventors further detected that no gouged region was generated at all after applying 30 through 70 m Torr of gas pressure. The reference numeral 67 shown in FIG. 15A designates the domain complete with an etching process, whereas the reference numeral 68 designates making member available for the etching process.

Figure 16A:
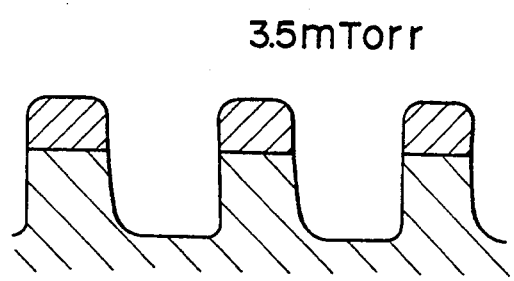
FIGS. 16A through 16C respectively are sectional views showing the aspects of the improved effect of the etched domain as a result of varying the gas pressure in the vacuum chamber.
Figure 16B:
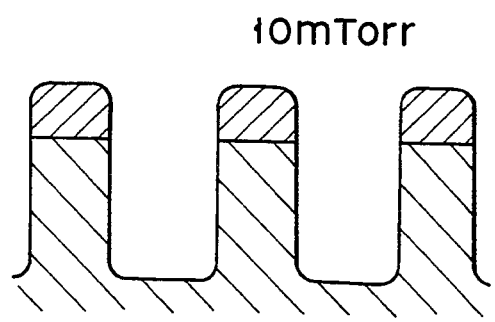
Figure 16C:
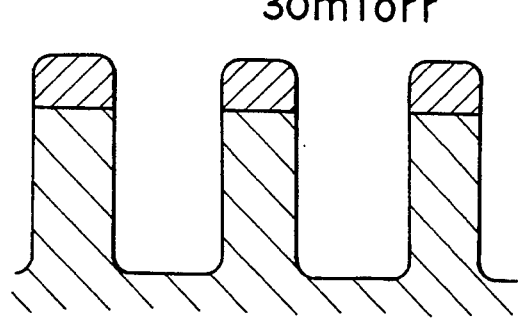

FIGS. 16A through 16C respectively designate the state of eliminating curve from the shape of the etched domain of the wafer 14. After applying 3.5 m Torr of gas pressure, a curve was generated on the side opposite from the electron-assembled domain 64, in other words, on the side where the effect of the etching process was low. The inventors confirmed that the curve symptom was substantially removed after applying 30 m Torr of gas pressure, and yet, no curve symptom was generated after applying 30 m Torr of gas pressure.

Figure 17:
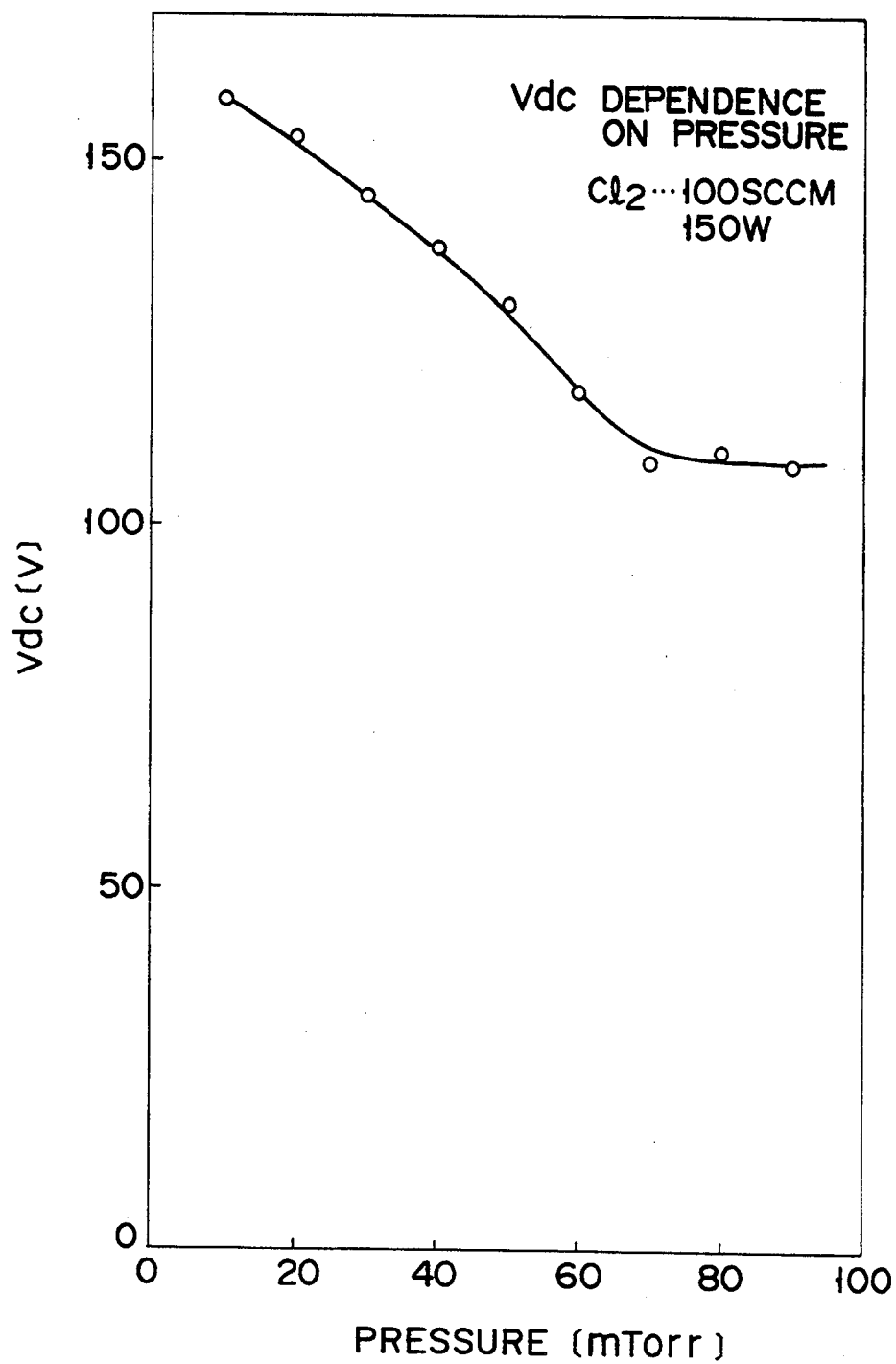
FIG. 17 is a graph of the relationship between self-bias voltage of the semiconductor wafer and the gas pressure.

FIG. 17 graphically illustrates the relationship between self-bias voltage Vdc of the wafer 14 and gas pressure. As is clear from this graph, the higher the gas pressure, the lower the self-bias voltage Vdc. The self-bias voltage Vdc is substantially constant in presence of 70 m Torr of gas pressure.

When the self-bias voltage Vdc is lowered, selective ratio sharing part of the etching characteristic is promoted. In addition, since the difference of the self-bias voltage Vdc on the wafer 14 can be decreased, the probability of generating damage like destruction of gate oxide film can be diminished.

Figure 18:
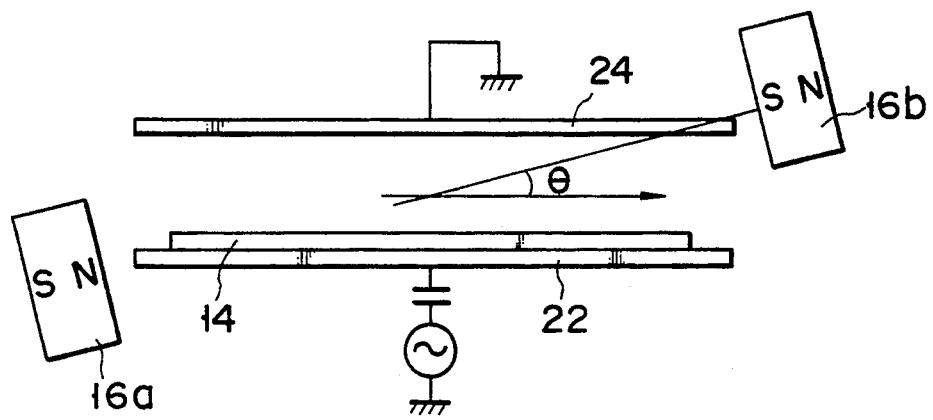
FIG. 18 is a schematic illustration of an experimental apparatus analyzing the relationship between the direction of the line of magnetic force generated between electrodes of the etching apparatus shown in FIG. 1 and the form of the etched domain.

Next, the relationship between the direction of the line of magnetic force generated between those parallel plane electrodes 22 and 24 of the magnetron plasma etching apparatus embodied by the invention and the shape of the etched wafer component is described below. As shown in FIG. 18, inventors carried out trial etching processes by obliquely disposing sample magnets 16a and 16b against those parallel plane electrodes 22 and 24.

Figure 19:
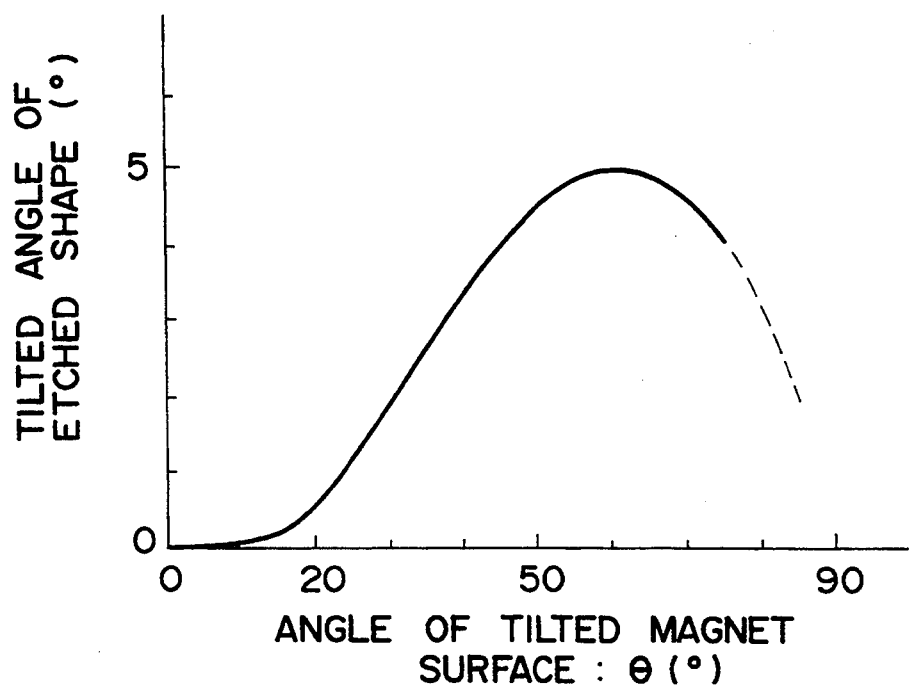
FIG. 19 is a graph of the relationship between the form of the etched domain in the center of the wafer and the angle of inclined permanent magnets against the surface of electrodes.

FIG. 19 graphically designates the tilted angle of the etched shape in the center relative to the degree of incline $\theta$ of those sample magnets 16a and 16b against the surface of those parallel plane electrodes 22 and 24. When the inclined angle $\theta$ was less than 15 degrees, the tilted angle of the etched shape was negligible. However, the inventors detected that the tilted angle of the etched shape sharply expanded relative to the expansion of the inclined angle $\theta$ beyond 15°. As a result, the inventors confirmed that an ideal etching process with precise directivity could be materialized by contracting the tilt angle between precisely set magnetic field and the wafer surface to less than 15 degrees, in other words, by contracting the ratio of the vertical component of magnetic field against the horizontal component to less than tan 15° = ¼. The inventors further confirmed from the test result that the permanent magnet 30 introduced to the magnetron plasma etching apparatus of the invention also contained the vertical component of magnetic field in a range less than one-fourth the horizontal component.

Next, the detail of the magnetron plasma processing apparatus according to the second embodiment of the invention is described below. Note that those components of the apparatus identical to those which are provided for the first embodiment are respectively designated by the identical reference numerals. Therefore, description of these is omitted here.

Figure 20:
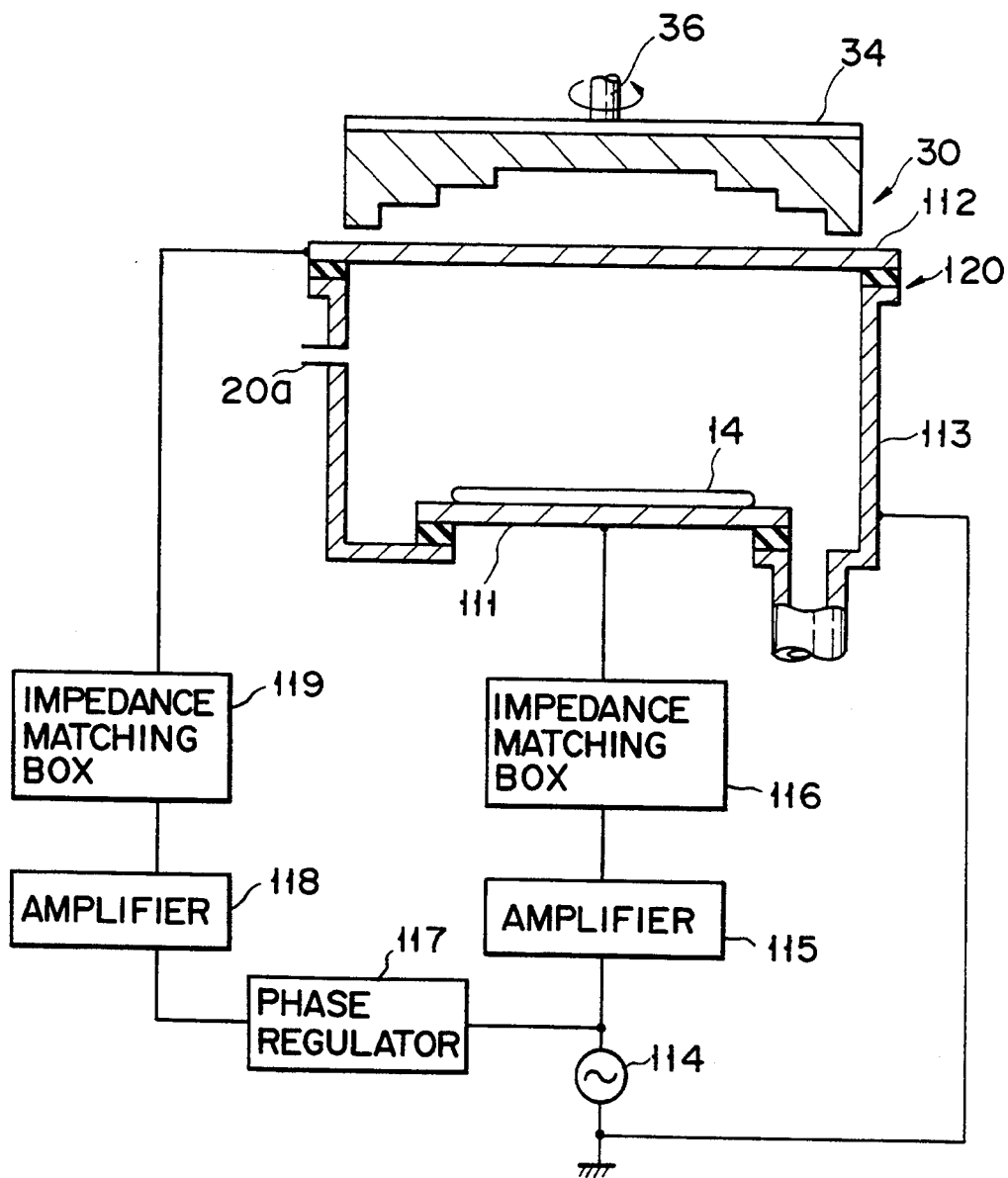
FIG. 20 is a schematic block diagram of the magnetron plasma processing (etching) apparatus according to the second embodiment of the invention.

The etching apparatus shown in FIG. 20 substantially being the magnetron plasma embodied by the invention is provided with the first electrode (the bottom electrode) 111 accommodating the wafer 14 on the upper surface, the second electrode (the upper electrode) 112 which is opposite from the first electrode 111, and the third electrode 113 which is concurrent with a ground reaction container. High-frequency power is delivered to the first and second electrodes 111 and 112.

Initially, a high-frequency oscillator 114 outputs oscillated frequencies to an amplifier 115 for amplification, and then high-frequency power is delivered to the first electrode 111 via an impedance matching box 116. On the other hand, oscillated frequencies output from the high-frequency oscillator 114 are delivered to the other amplifier 118 for amplification via a phase regulator 117, and then high-frequency power is delivered to the second electrode 112 via the other impedance matching box 119. Since high-frequency power is delivered to the first and second electrodes 111 and 112 from the identical high-frequency oscillator 114, high-frequency power to be delivered to both electrodes is held in a constant phasewise relationship by the phase regulator 117, and thus, discharge is stably maintained.

The etching velocity can be maximized by optionally regulating the phase relationship of supplied power. The etching apparatus according to the second embodiment of the invention properly regulates those amplifiers 115 and 118. As a result, self-bias voltage generated in the first and second electrodes 111 and 112 can be set to an optional ratio. This in turn balances electrons performing drifting movement on the upper and bottom electrodes to permit the apparatus to uniformly execute etching processes.

According to the composition of the magnetron plasma etching apparatus based on the second embodiment, depending on materials subject to the etching process and the characteristic required for the etching process, the apparatus can freely set electric field that should be provided in the neighborhood of those upper and bottom electrodes as an advantageous feature. In consequence, the apparatus can precisely execute all the etching processes with satisfactory selectivity.

In place of the structure mentioned above, the second embodiment may provide the apparatus with a pair of high-frequency oscillators 114 in order to feed high-frequency power containing different frequencies to the first and second electrodes 111 and 112. For example, if either of these two high-frequency oscillators 114 provides the second electrode 112 with a certain high-frequency voltage beyond the capability of ions to follow up and the other high-frequency oscillator 114 provides the first electrode 111 with a low-frequency voltage, then, the apparatus can selectively execute an etching process against the wafer 14 mounted on the first electrode 111 by way of effectively preventing the material of the second electrode 112 from wearing itself.

FIG. 21 schematically designates the magnetron plasma processing apparatus according to the third embodiment of the invention. Note that those components identical to those which are shown in FIGS. 1 and 20 are designated by the identical reference numerals. Therefore, description of these components is omitted.

In place of directly feeding high-frequency voltage to the second electrode 112, the magnetron plasma processing apparatus according to the third embodiment directly connects a variable inductor 122 and a capacitor 121 to the second electrode 112 in series, where the inductor 122 and the capacitor 121 are respectively grounded as shown in FIG. 21. The magnetron plasma etching apparatus preliminarily selects both the capacitor 121 and the inductor 122 in order that serial resonant frequency of the capacitor 121 and the inductor 122 can substantially match the frequency output from the high-frequency oscillator 114.

The capacitor 121 insulates the second electrode 112 using DC component. Phase of high-frequency voltage induced to the second electrode 112 can properly be adjusted by regulating the inductor 122, and thus, self-bias voltage generated on the surface of the second electrode 112 can also be adjusted. As a result, as was done for the second embodiment, drifting movement performed by electrons on the upper and bottom electrodes can properly be balanced to permit the apparatus to uniformly execute the etching processes. When the phase of high-frequency voltage delivered to the second electrode 112 is properly adjusted, plasma assemble in the center of the second electrode 112 to promote density of plasma in the center of this electrode, and conversely, plasma can also be dispersed to the peripheral edges of this electrode.

It is desired that the impedance of the capacitor 121 and the inductor 122 connected to the second electrode 112 be correctly identical to the impedance of the high-frequency oscillator 114. Although ground wire is connected to the third electrode 113, since the third electrode 113 contains impedance, induced voltage is partly generated, thus providing a certain potential for the third electrode 113.

When operating the magnetron plasma etching apparatus of the third embodiment, self-bias voltage generated on the surface of the upper electrode 112 has such a variable range which is narrower than that is provided for the apparatus of the second embodiment. On the other hand, owing to relatively simple structure, the apparatus based on the third embodiment can be manufactured at inexpensive cost.

The magnetron plasma etching apparatus of the third embodiment may use such an inductor 122 containing a preliminarily optimized stationary value. In place of the structure mentioned above, the apparatus of the third embodiment can also feed high-frequency voltage to the second electrode 112, and in addition, the capacitor 121 and the variable inductor 122 can be inserted between the first electrode 111 and the ground terminal.

Next, an example of the variation of the permanent magnet 30 of the magnetron plasma etching apparatus is described below. As shown in FIG. 22, the permanent magnet 30 of the modified version consists of a main magnet 130, a non-magnetic member 132, and a counter magnet 134. As shown in FIG. 23 for example, the main magnet 130 is substantially a rectangular permanent magnet having plural steps on both sides. The line of magnetic force is provided across the N-pole and the S-pole in the direction orthogonally intersecting the longitudinal axial direction of the main magnet 130. A plane recess 130a is provided in the center of this main magnet 130, where the main magnet 130 is secured right above the upper surface of the vacuum chamber 20 by way of pronely disposing the plane recess 130a in order that part of magnetic flux can penetrate through the plasma atmosphere in the vacuum chamber 20.

The counter magnet 134 is provided on the main magnet 130 via the non-magnetic member made from aluminium or resinous material. The counter magnet 134 is provided with specific strength identical to that of the main magnet 130 (where the strength may not necessarily be exactly identical to each other) and the structure exactly identical to that of the main magnet shown in FIG. 23. The main magnet 130 and the counter magnet 134 are respectively provided with phases which are electromagnetically and physically opposite from each other by 180° C. For example, opposite magnetic poles are disposed in opposition from each other as shown in FIG. 22.

A motor 136 is connected to the center plane recess 134a of the counter magnet 134 via a rotary shaft 36. The motor 136 rotates the permanent magnet 30 which is composed of the main and counter magnets 130 and 134.

Since these main and counter magnets 130 and 134 are vertically disposed by way of aligning opposite magnetic poles in opposition from each other, magnetic flux generated from the N-pole of the main magnet 130 on the part of the counter magnet 134 is attracted by the S-pole of the counter magnet 134, and conversely, magnetic flux generated from the N-pole of the counter magnet 134 on the part of the main magnet 130 is attracted by the S-pole of the main magnet 130. This in turn decreases the amount of magnetic flux orthogonally hitting against a shield 140 secured to the base of the apparatus by way of covering the permanent magnet 30, thus promoting the shielding effect of the shield 140 itself.

Figure 24:
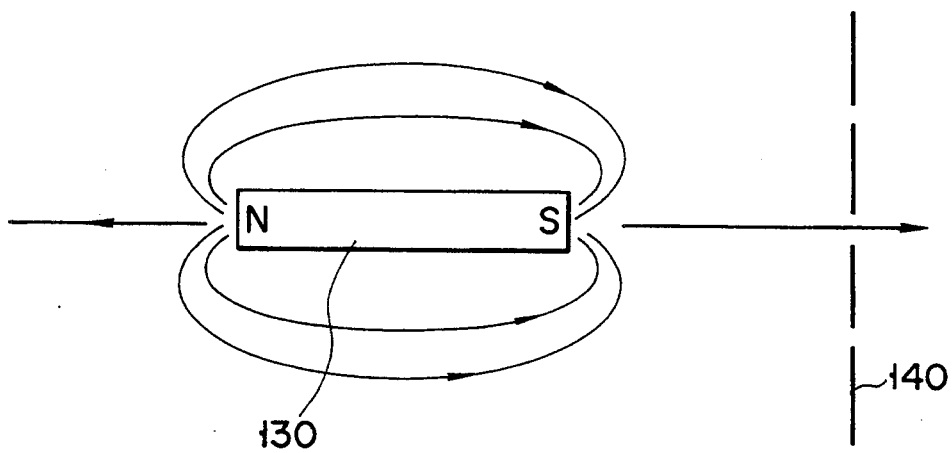
FIG. 24 is a schematic illustration of the line of magnetic force of a permanent magnet.

When the main magnet 130 is solely provided for the apparatus as shown in FIG. 24, magnetic flux diffusing in the direction orthogonally hitting against the shield 140 permeates through the shield 140, thus losing the own shielding effect of the shield 140 itself. Additional provision of the counter magnet 134 causes opposite magnetic poles of the main and counter magnet 130 and 134 to attract each other, thus decreasing the amount of leaked magnetic flux and promoting the shielding effect of the shield 140 itself.

Figure 25:
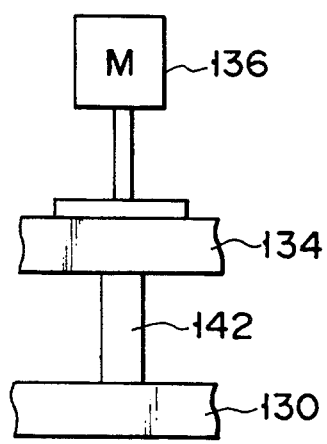
FIG. 25 is a partial view of another modified permanent magnet.

The main and counter magnets 130 and 134 composing the permanent magnet 30 shown in FIG. 22 are coupled with each other via the non-magnetic member 132. In place of this triple composition, as shown in FIG. 25, the main and counter magnets 130 and 134 may directly be coupled with each other across a vertically erected rotary shaft 142.

Figure 26:
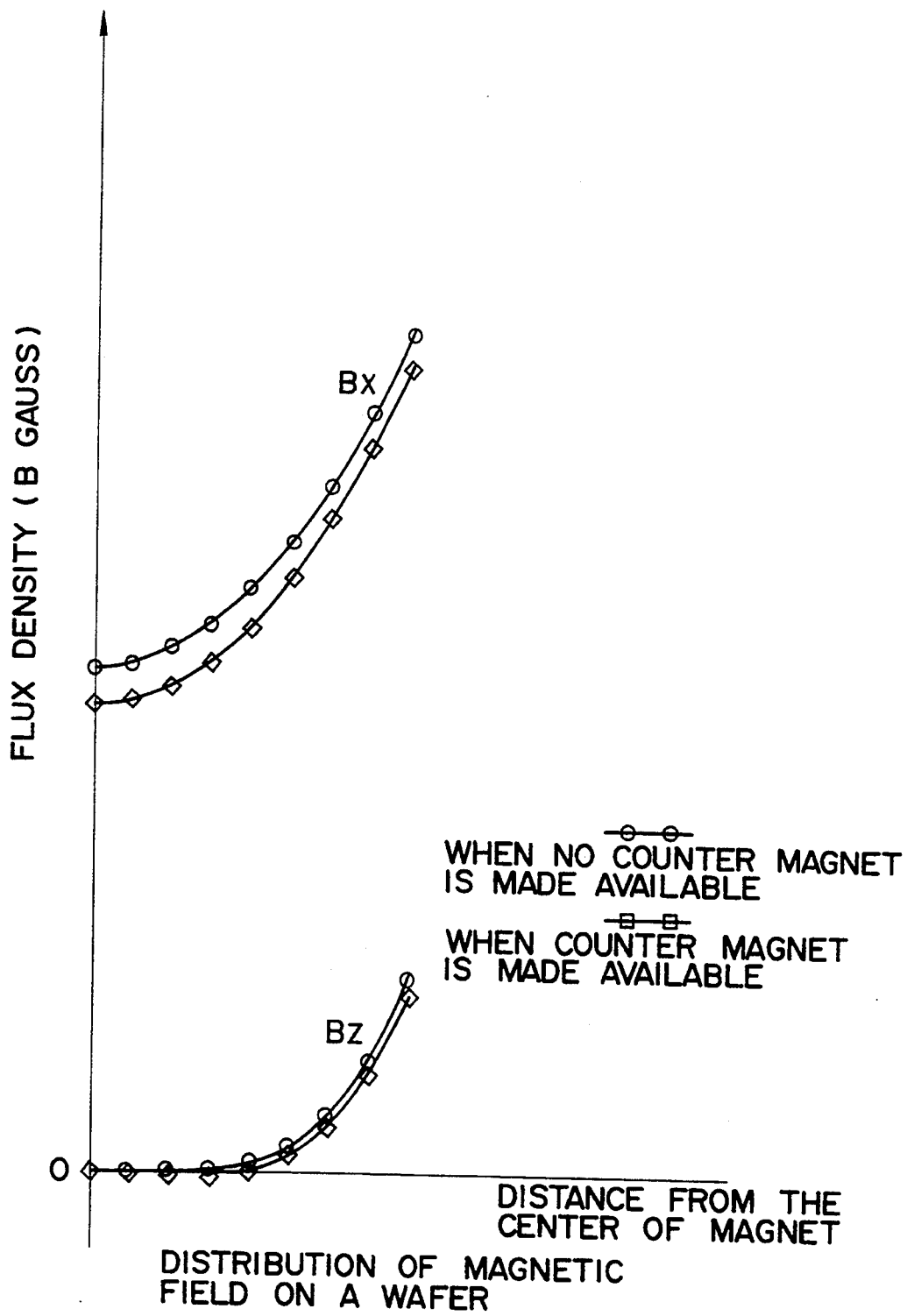
FIG. 26 is a graph of the distribution of magnetic field on a semiconductor wafer.

FIG. 26 graphically illustrates the distribution of magnetic field on the wafer 14 when the main magnet 130 is solely made available for composing the permanent magnet 30 and when both the main and counter magnets 130 and 134 in conjunction compose the permanent magnet 30. The curve with round symbols designates the distribution of magnetic field when the main magnet 130 is solely made available, whereas the curve with square symbols designates the distribution of magnetic field when the main and counter magnets 130 and 134 are in conjunction made available.

Figure 27:
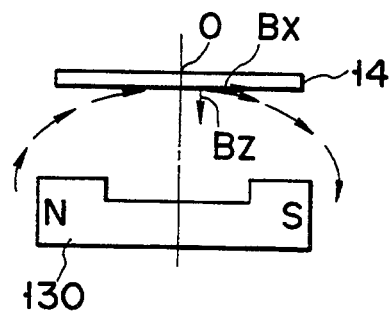
FIG. 27 is a lateral view of the semiconductor wafer and a permanent magnet explanatory of FIG. 26.

As shown in FIG. 27, the horizontal axis designates the distance from the center of the main magnet 130, in other words, from the center of the wafer 14. On the other hand, the vertical axis designates the density of magnetic flux. The reference character "Bx" shown in FIG. 26 designates horizontal component (component X) of the density of magnetic flux at respective local points apart from the center position "0" of the wafer 14. On the other hand, the reference character "Bz" shown in FIG. 26 designates vertical component (component Z) of the density of magnetic flux in those corresponding points.

It is clear from the graphical chart shown in FIG. 26 that, even when the counter magnet 134 is provided, magnetic field applied to the wafer 14 in the vacuum chamber 20 substantially remains constant.

Figure 28:
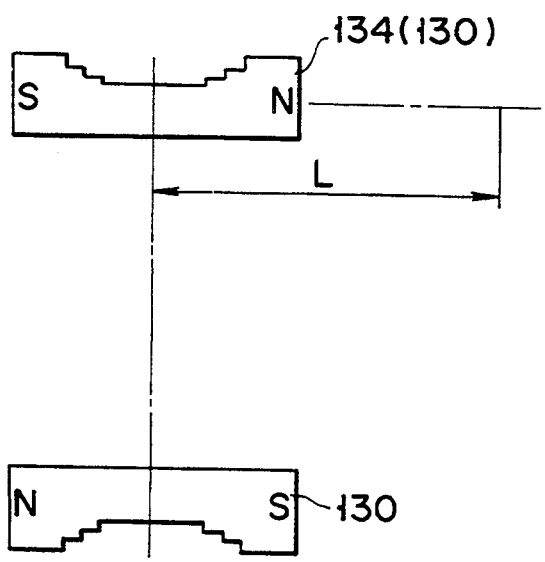
FIG. 28 is a lateral view of a permanent magnet explanatory of FIG. 29.
Figure 29:
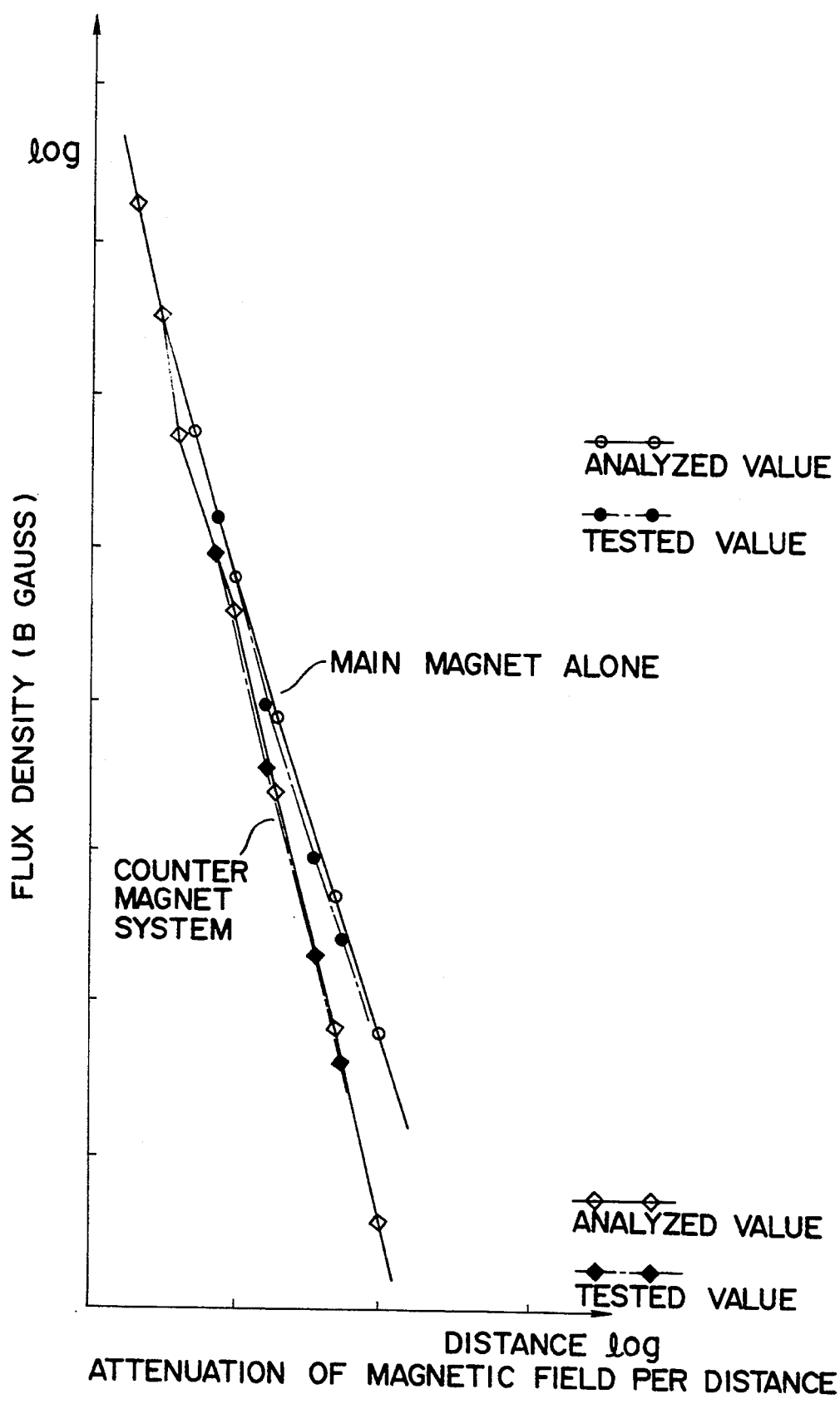
FIG. 29 is a graph of the relationship between the distance from the center of the magnet and the leaked magnetic flux.

FIG. 29 graphically designates the result of analyzing the leaked magnetic flux (horizontal component) relative to the distance L (see FIG. 28) from the center of the main magnet 130 or the center of the counter magnet 134 when the main magnet 130 is solely provided and also when the counter magnet 134 is in conjunction provided for composing the permanent magnet 30.

As is clear from the graphical chart shown in FIG. 29, when the counter magnet 134 is in conjunction provided, the analyzed value indicates that there is no substantial difference in the amount of leaked magnetic flux when the distance L is several times less than the diameter of those available magnets. On the other hand, when the diameter L is several times longer than the diameter of those available magnets, the difference between the amount of leaked magnetic flux when solely applying the main magnet 130 and the amount of leaked magnetic flux when applying the main and counter magnets 130 and 134 in conjunction gradually expands.

Figure 30:
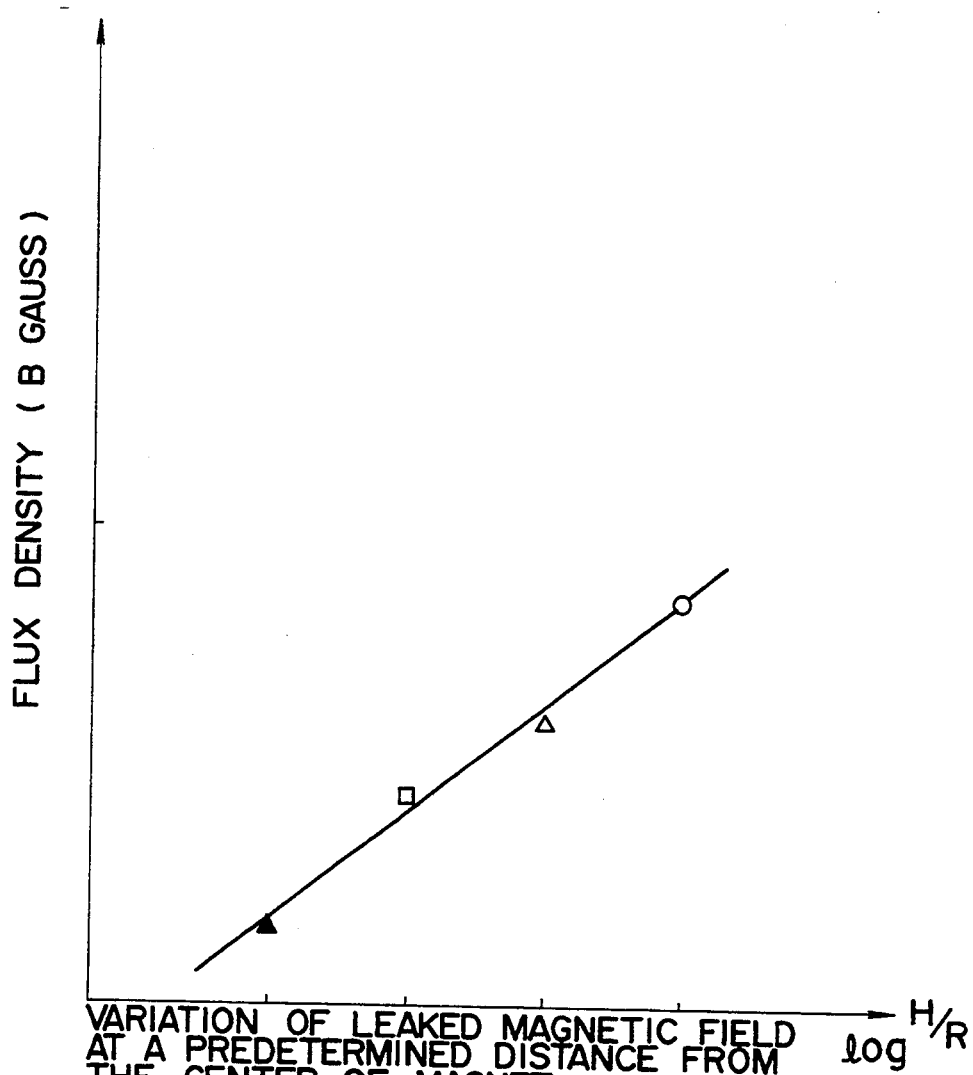
FIG. 30 is a graph of the relationship between the distance between magnet elements and the leaked magnetic flux.
Figure 31:
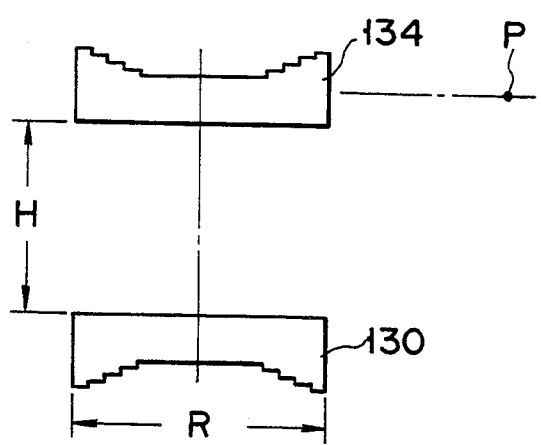
FIG. 31 is a lateral view of a permanent magnet explanatory of FIG. 30.

FIG. 30 graphically illustrates the result of analyzing the leaked magnetic flux at a point which is horizontally apart from the center of the counter magnet 134 by a predetermined distance after varying the distance H between the main and counter magnets 130 and 134 against diameter R of these magnets made available for the counter magnet system (see FIG. 31). It is clear from these graphical charts that the longer the distance H between both magnets, the greater the amount of leaked flux which is linearly incremental at the predetermined point P. In other words, the shorter the distance between the main and counter magnets 130 and 134, the less the amount of leaked magnetic flux.

FIG. 32 graphically illustrates the variation of the density of magnetic flux at the center of the wafer 14 relative to the variation of the distance H between the main and counter magnets 130 and 134 available for the counter magnet system. Even when the counter magnet 134 is close to the main magnet 130, the density of magnetic flux at the center of the wafer 14 mildly decreases.

The above description on the modification of the permanent magnet 30 has solely referred to the case in which those main and counter magnets 130 and 134 are respectively and substantially the permanent magnet 30. Alternatively, either or both of these magnets may be composed of an electromagnet. In either case, it is essential for the apparatus of the invention to uniformly generate magnetic field in parallel with the surface of the wafer 14 and provide an appropriate means for generating such magnetic field oriented in the direction 180° apart from that of the horizontal magnetic field in parallel with the surface of the wafer so that this horizontal magnetic field can fully be offset.

The above description has referred to a variety of embodiments of the invention covering the magnetron plasma processing apparatus and the method of properly executing dry etching process against semiconductor wafers using this apparatus. As far as magnetron plasma is securely made available, the scope of the invention may also effectively be applied to those surface processing apparatuses available for executing chemical vapor deposition process or sputtering process or the like.

It should be understood that the invention is not merely confined to those embodiments and modifications thus far described, but the invention may also be embodied and modified in a variety of useful ways without substantially departing from the spirit and scope of the invention.

What is claimed is:

1. A magnetron plasma processing apparatus comprising:
    a vacuum chamber;
    first and second electrodes provided in the vacuum chamber to be parallel with each other, the first electrode holding an object to be etched and positioned on one side of the second electrode with an interval therebetween;
    means for supplying gas to the vacuum chamber;
    magnetic-field generating means including a magnetic block provided outside the vacuum chamber on the opposite side of the second electrode and rotatable about an axis normal to the object held by the first electrode, the magnetic block including a surface facing the vacuum chamber, the surface having magnetic poles whose polarities are opposed to each other and a recess positioned between the magnetic poles; and
    means for supplying power to at least one of the first and second electrodes to generate discharge between the electrodes;
    whereby when the magnetic block is rotated, a magnetic field substantially parallel to the object over the entire surface thereof is generated between the electrodes;
    wherein said recess of said magnetic-field generating means has lateral sides which are respectively formed stepwise or with tapered shape.

2. A magnetron plasma processing apparatus comprising:
    a vacuum chamber;
    first and second electrodes provided in the vacuum chamber to be parallel with each other, the first electrode holding an object to be etched and positioned on one side of the second electrode with an interval therebetween;
    means for supplying gas to the vacuum chamber;
    magnetic-field generating means including a magnetic block provided outside the vacuum chamber on the opposite side of the second electrode and rotatable about an axis normal to the object held by the first electrode, the magnetic block including a surface facing the vacuum chamber, the surface having magnetic poles whose polarities are opposed to each other and a recess positioned between the magnetic poles; and
    means for supplying power to at least one of the first and second electrodes to generate discharge between the electrodes;
    whereby when the magnetic block is rotated, a magnetic field substantially parallel to the object over the entire surface thereof is generated between the electrodes;
    wherein said recess of said magnetic-field generating means is formed in order that vertical component of magnetic field between said pair of parallel electrodes against the upper surface of said etching object can remain less than one-fourth the horizontal component.

3. A magnetron plasma processing apparatus comprising:
    a vacuum chamber;
    first and second electrodes provided in the vacuum chamber to be parallel with each other, the first electrode holding an object to be etched and positioned on one side of the second electrode with an interval therebetween;
    means for supplying gas to the vacuum chamber;
    magnetic-field generating means including a magnetic block provided outside the vacuum chamber on the opposite side of the second electrode and rotatable about an axis normal to the object held by the first electrode, the magnetic block including a surface facing the vacuum chamber, the surface having magnetic poles whose polarities are opposed to each other and a recess positioned between the magnetic poles; and
    means for supplying power to at least one of the first and second electrodes to generate discharge between the electrodes;
    whereby when the magnetic block is rotated, a magnetic field substantially parallel to the object over the entire surface thereof is generated between the electrodes;
    wherein said first electrode has an area wider than that of said object to be etched, and an area of said first electrode which does not hold said etching object is covered by conductive material or insulating material having less than 1 mm of thickness.

4. A magnetron plasma processing apparatus according to claim 1, wherein said means for supplying gas has means for adjusting pressure inside of said vacuum chamber to a range from 10 m Torr to a maximum of 100 m Torr.

5. A magnetron plasma processing apparatus comprising:
    a vacuum chamber;
    first and second electrodes provided in the vacuum chamber to be parallel with each other, the first electrode holding an object to be etched and positioned on one side of the second electrode with an interval therebetween;
    means for supplying gas to the vacuum chamber;
    magnetic-field generating means including a magnetic block provided outside the vacuum chamber on the opposite side of the second electrode and rotatable about an axis normal to the object held by the first electrode, the magnetic block including a surface facing the vacuum chamber, the surface having magnetic poles whose polarities are opposed to each other and a recess positioned between the magnetic poles;
    means for supplying power to at least one of the first and second electrodes to generate discharge between the electrodes;
    whereby when the magnetic block is rotated, a magnetic field substantially parallel to the object over the entire surface thereof is generated between the electrodes; and
    a compensatory magnetic-field generating means which generates magnetic field in the direction opposite from said magnetic-field generating means and then minimizes leaked magnetic field from said magnetic-field generating means.

* * * * *